(12) United States Patent
Matsui et al.

(10) Patent No.: US 6,408,045 B1
(45) Date of Patent: Jun. 18, 2002

(54) STAGE SYSTEM AND EXPOSURE APPARATUS WITH THE SAME

(75) Inventors: Shin Matsui, Urawa; Shinji Ohishi, Oyama; Eiji Osanai, Yokohama; Tadayuki Kubo, Ushiku, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/187,408

(22) Filed: Nov. 6, 1998

(30) Foreign Application Priority Data

| Nov. 11, 1997 | (JP) | 9-308607 |
| Apr. 9, 1998 | (JP) | 10-114119 |
| Apr. 9, 1998 | (JP) | 10-114208 |
| Apr. 9, 1998 | (JP) | 10-114219 |

(51) Int. Cl.[7] ............................................. G21K 5/00
(52) U.S. Cl. ................... 378/34; 378/204; 378/205; 378/206; 378/208
(58) Field of Search ......................... 378/34, 205, 204, 378/206, 208

(56) References Cited

U.S. PATENT DOCUMENTS

| 4,993,696 A | | 2/1991 | Furukawa et al. ............. 269/73 |
| 5,040,431 A | | 8/1991 | Sakino et al. .................. 74/479 |
| 5,280,677 A | | 1/1994 | Kubo et al. .................... 33/568 |
| 5,518,550 A | | 5/1996 | Korenaga et al. ............ 118/729 |
| 5,524,131 A | * | 6/1996 | Uzawa et al. .................. 378/34 |
| 5,610,686 A | | 3/1997 | Osanai ........................... 355/72 |
| 5,666,038 A | * | 9/1997 | Ohishi ........................... 318/625 |
| 5,684,856 A | * | 11/1997 | Itoh et al. ...................... 378/34 |
| 5,701,041 A | | 12/1997 | Akutsu et al. ................. 310/12 |
| 5,806,193 A | * | 9/1998 | Ebihara ......................... 33/1 M |
| 5,835,195 A | * | 11/1998 | Gibson et al. ................. 355/53 |
| 5,858,587 A | | 1/1999 | Yamane et al. ............... 430/22 |
| 5,864,389 A | | 1/1999 | Osanai et al. ................. 355/53 |
| 5,909,272 A | * | 6/1999 | Osanai et al. ................. 355/53 |
| 5,930,324 A | * | 7/1999 | Matsui et al. .................. 378/34 |
| 5,933,215 A | * | 8/1999 | Inoue et al. ................... 355/53 |
| 6,028,376 A | * | 2/2000 | Osanai et al. ................. 310/12 |
| 6,072,183 A | * | 6/2000 | Itoh et al. ................. 250/492.2 |
| 6,081,581 A | * | 6/2000 | Hasegawa .................... 378/145 |

FOREIGN PATENT DOCUMENTS

| EP | 0 360 272 | 3/1990 |
| EP | 0 501 724 | 9/1992 |
| EP | 0 557 100 | 8/1993 |
| GB | 2 290 658 | 3/1996 |

OTHER PUBLICATIONS

Norio Uchida, et al., "A Vertical X–Y Stage for X–Ray Lithography Using SOR", *Bull of the Japan Soc. of Precision Engineering*, vol. 22, No. 2 (jun. 1988), pp. 102 to 108.

* cited by examiner

*Primary Examiner*—Robert H. Kim
*Assistant Examiner*—Allen C. Ho
(74) *Attorney, Agent, or Firm*—Fitzpatrick, Cella, Harper & Scinto

(57) ABSTRACT

A stage system includes a first stage movable along a reference plane, containing a vertical direction, and in the vertical direction or in a first direction close to the vertical direction, a second stage movable in a second direction intersecting with the first direction and relative to the first stage, a first driving mechanism for moving the first stage in the first direction, a second driving mechanism for moving the second stage in the second direction, a countermass movable in the first direction, and a third driving mechanism for moving the countermass in a direction opposite to the first direction.

71 Claims, 24 Drawing Sheets

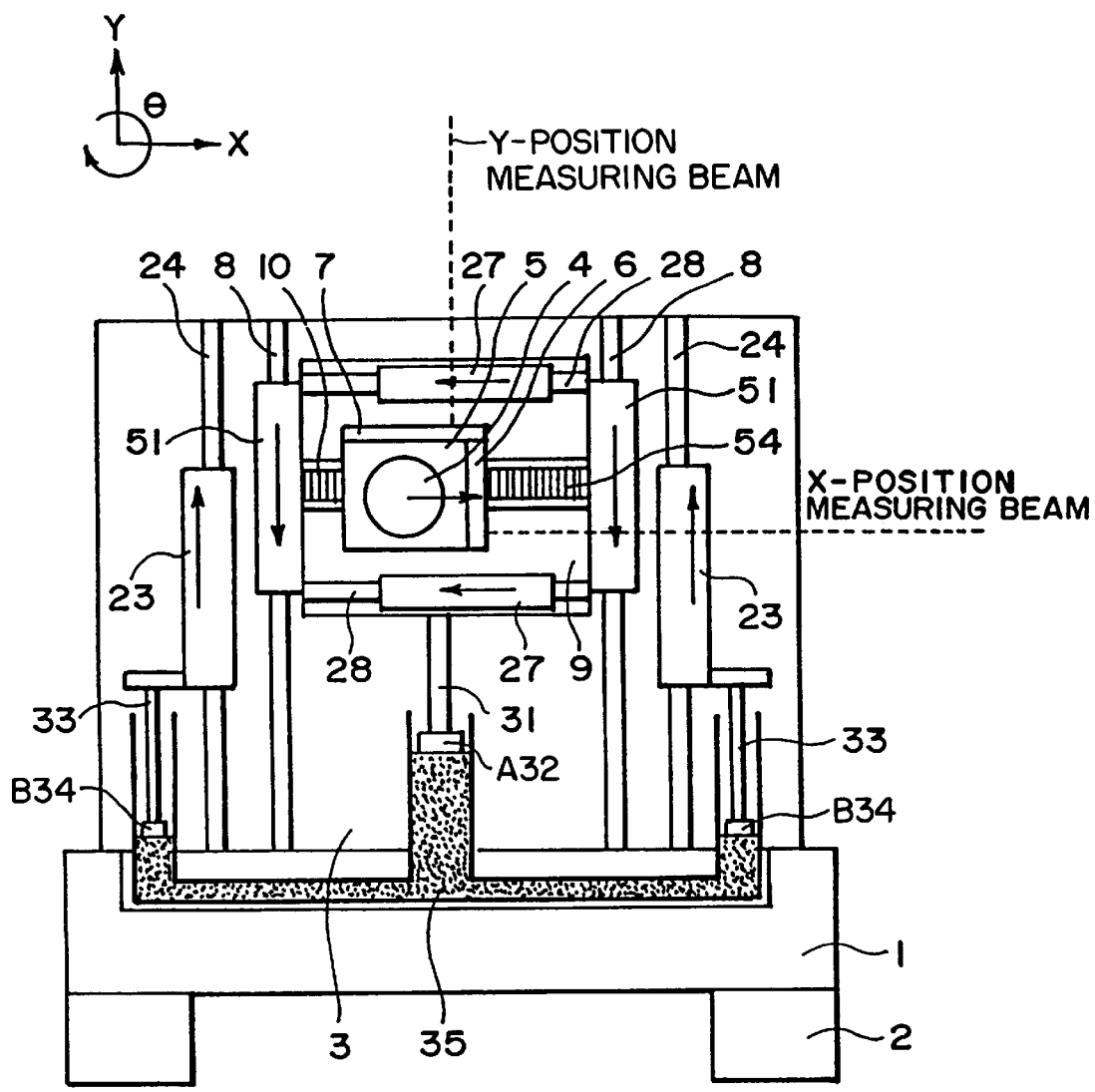
F I G. 1

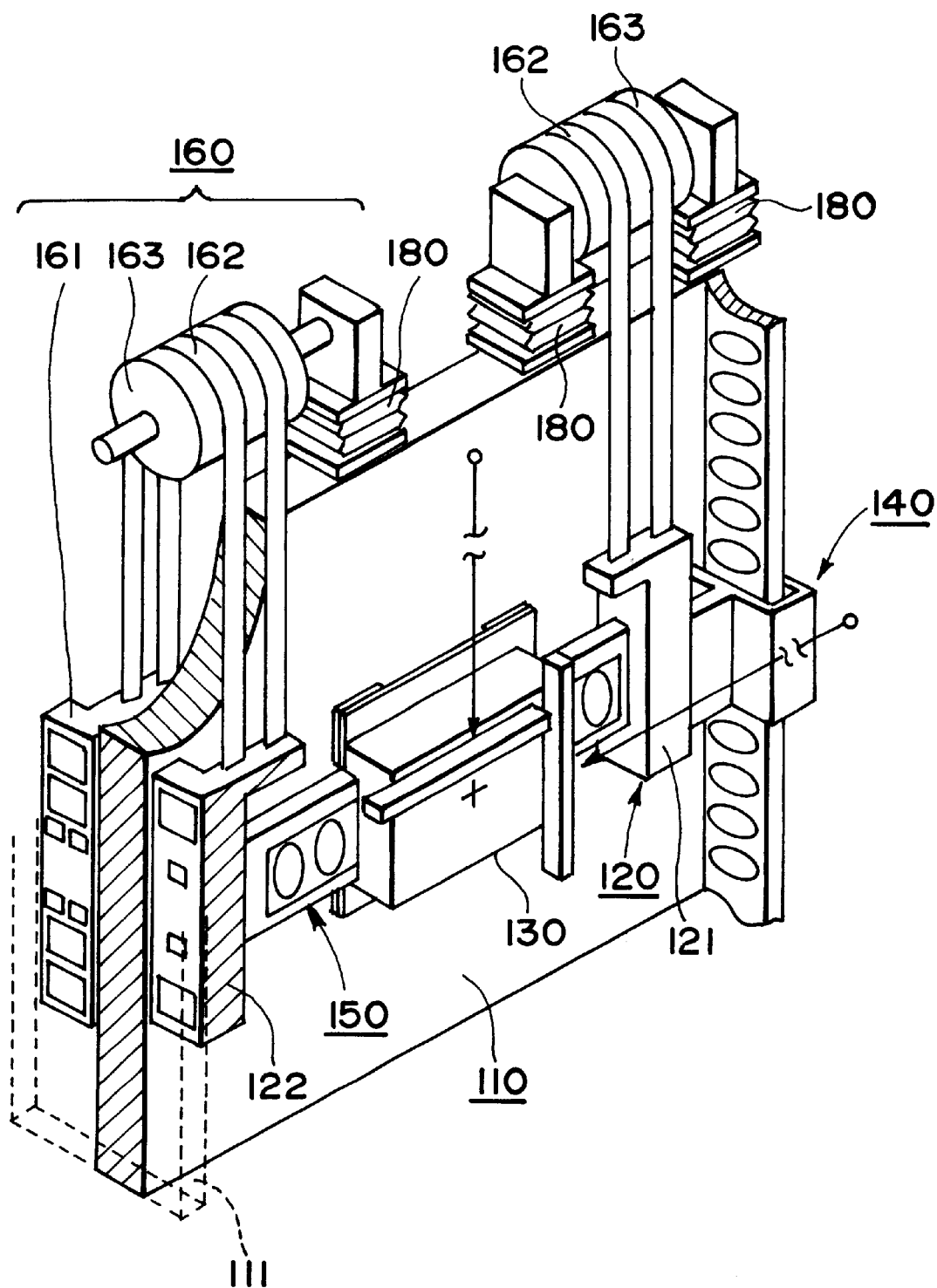
F I G. 20

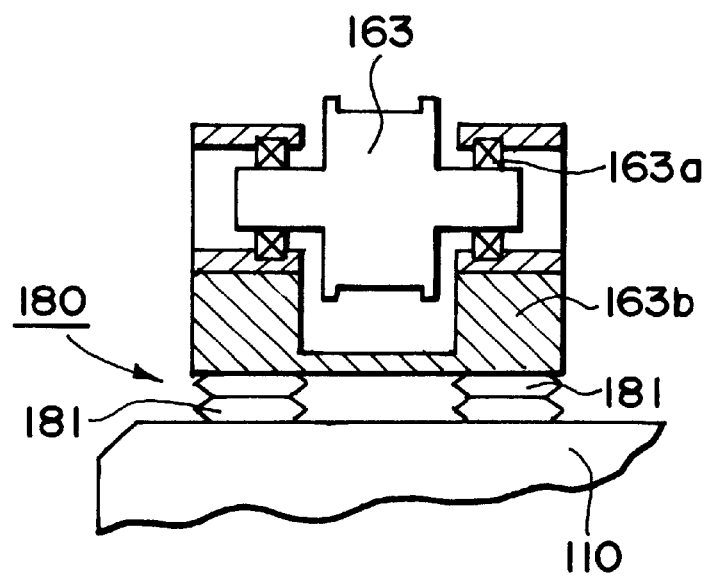
F I G. 21
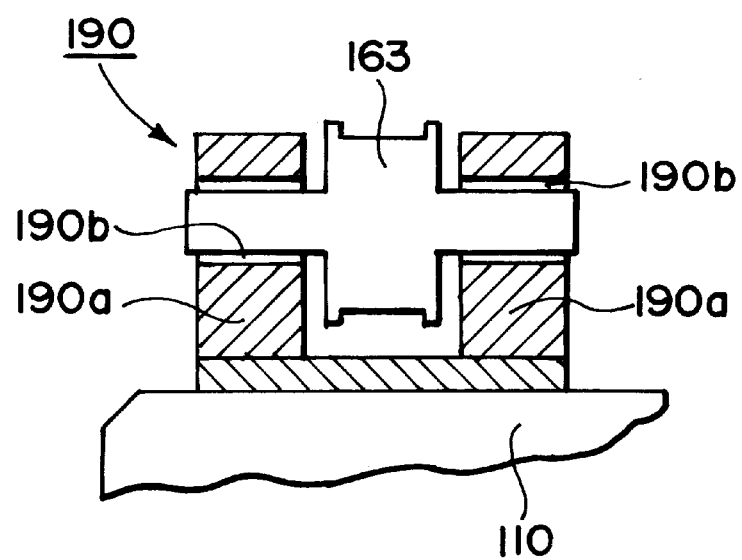
F I G. 22

STAGE SYSTEM AND EXPOSURE APPARATUS WITH THE SAME

FIELD OF THE INVENTION AND RELATED ART

This invention relates to a stage system for use in exposure apparatuses for a lithographic process in the manufacture of semiconductor devices, for example, or for use in various precision machining apparatuses or various precision measuring instruments, for example. In another aspect, the invention is concerned with an exposure apparatus with such a stage system and/or a device manufacturing method using the same.

As an exposure apparatus for the manufacture of semiconductor devices, for example, there is an apparatus called a stepper. In such a stepper, a pattern of an original such as a reticle or mask is printed repeatedly on a single substrate such as a wafer while moving stepwise the substrate relative to a projection optical system, for projecting the pattern to the substrate.

For a stage system for moving a wafer substrate stepwise relative to a projection optical system of a stepper and for positioning the substrate, a higher precision is required due to increasing density of integration of semiconductor devices.

On the other hand, recently, in order to increase the number of device products obtainable from a single wafer, that is, the productivity, the size of the wafer is increasing. This leads to enlargement in the size and weight of a stage system in a stepper. In order to assure a required precision under such a tendency, the dynamic characteristic of a stage system should be improved further. The rigidity of a guide should be enlarged, for example. However, this results in further enlargement in weight of the stage system as a whole.

In addition, for reduction of cost of a semiconductor device, it has been required to shorten the exposure cycle time to increase the throughput. Thus, high speed driving of a stage for moving a wafer, for example, is desired. However, in order to increase the speed of a large size and heavy weight stage, the rigidity of a supporting frame for supporting the stage must be enhanced. This results in considerable enlargement in size and weight of the whole mechanism as well as an increase of cost.

In X-ray exposure apparatuses which use recently developed soft X-rays (charged particle accumulation ring radiation light) as exposure light, a vertical type stage for holding a substrate such as a wafer in its upstanding position and for moving the substrate stepwise two-dimensionally along a vertical reference plane or a reference plane close to it, is used. In such a vertical type stage, in addition to the problems resulting from enlargement in size or increase of speed as described, there is another problem that: since the stage is to be moved in a gravity direction, use of a countermass mechanism, for example, is necessary for the weight compensation of the stage. However, any vibration of such a countermass mechanism will cause external disturbance that degrades wafer positioning precision. Thus, the dynamic characteristic of the stage is deteriorated remarkably.

FIGS. 27 and 28 show an example of such a vertical type stage. This stage comprises an X-Y stage including a Y stage 1120 which is reciprocally movable in a Y-axis direction (vertical direction) along a stage base 1110, mounted on a base 1110a, an X stage 1130 which is reciprocally movable in an X-axis direction along the Y stage 1120, a cylinder 140 for moving the Y stage 1120 in the Y-axis direction, and a linear motor (not shown) for moving the X stage 1130 in the X-axis direction.

The stage base 1110 has a guiding surface for supporting, without contact, the bottom face of the Y stage 1120 through air pads, for example. At an end of the stage base 1110, there is a Y guide (not shown) for guiding the Y stage 1120 in the Y-axis direction. The Y guide and the Y stage 1120 are kept out of contact with each other, by means of air pads, for example.

Weight compensation mechanism 1160 serves to cancel the weight of the Y stage 1120, the X stage 1130 and the wafer (not shown) held by it. The mechanism comprises a belt 1162 with the Y stage 1120 suspended at one end thereof and with a countermass 1161 suspended at another end thereof. The belt extends around and is supported by a pulley 1163. The weight of the countermass 1161 is set to be balanced with the weight of stage movable components, including the Y stage 1120, the X stage 1130 and the wafer held thereby.

With this arrangement, however, when the X stage moves in the X-axis direction upon the Y stage, the gravity center position of the stage movable components including the Y stage and X stage shifts. Thus, the balance of rotational moment about the Z axis (wZ-axis direction) changes. However, this moment can not be supported only by the countermass, and an excessively large load is applied to the Y guide (yaw guide) of the Y stage.

In order to support such a large load, the rigidity of the Y guide has to be enlarged. However, increasing the rigidity of the Y guide necessitates enlargement in size of the Y guide, for example. This results in further enlargement in size and weight of the stage mechanism as a whole, and causes degradation of the dynamic characteristic of the stage. Finally, improvement of positioning precision or positioning speed is disturbed.

For a belt that connects the stage and the countermass, generally, a steel belt or wire is used. When the stage moves, there occurs natural or proper vibration of several tens of Hz due to insufficiency of rigidity of the steel belt or the like. In addition to this, a natural vibration of not less than 50 Hz, for example, of the countermass itself is propagated through the belt to the stage. These vibrations degrade the stage positioning precision, and this is a large bar to improvement of the frequency response characteristic of the positioning control system.

SUMMARY OF THE INVENTION

It is an object of the present invention to provide an improved stage system by which a dynamic characteristic of a vertical type stage having a weight compensation mechanism such as a countermass can be improved, whereby enhancement of positioning speed and/or positioning precision can be accelerated considerably without enlargement in size of the mechanism.

It is another object of the present invention to provide an exposure apparatus and/or a device manufacturing method which uses such a stage system as described above.

In accordance with an aspect of the present invention, there is provided a stage system, comprising: a first stage movable along a reference plane, containing a vertical direction, and in the vertical direction or in a first direction close to the vertical direction; a second stage movable in a second direction intersecting with the first direction and relative to the first stage; a first driving mechanism for moving the first stage in the first direction; a second driving mechanism for moving the second stage in the second direction; a countermass movable in the first direction; and a third driving mechanism for moving the countermass in a direction opposite to the first direction.

In accordance with another aspect of the present invention, there is provided a stage system, comprising: a first stage movable along a reference plane, containing a vertical direction, and in the vertical direction or in a first direction close to the vertical direction; a second stage movable in a second direction intersecting with the first direction and relative to the first stage; a countermass movable in the first direction; a first driving mechanism for moving the first stage in the first direction; and a second driving mechanism for moving the second stage in the second direction; wherein said first driving mechanism includes a magnet and a coil one of which is mounted on one of the first stage and the countermass and the other of which is mounted on the other of the first stage and the countermass, such that the countermass moves in a direction opposite to the first stage.

In accordance with a further aspect of the present invention, there is provided a stage system, comprising: a stage movable along a reference plane, containing a vertical direction, and in the vertical direction or a direction close to the vertical direction; a countermass, balancing with a weight of the stage; connecting members for connecting the countermass to the stage; a pulley for supporting said connecting members; and an anti-vibration mechanism for reducing vibration to be propagated from said connecting members to the stage.

In accordance with a yet further aspect of the present invention, there is provided a stage system, comprising: a stage movable along a reference plane, containing a vertical direction, and in the vertical direction or a first direction close to the vertical direction; connecting members connected to the stage; a pulley for supporting said connecting members; a motor for rotationally driving the pulley and for compensating for a weight of the stage; and an anti-vibration mechanism for reducing vibration to be propagated from said connecting members to the stage.

In accordance with a still further aspect of the present invention, there is provided a stage system, comprising: a stage movable along a reference plane, containing a vertical direction, and in the vertical direction or a direction close to the vertical direction; a countermass, balancing with a weight of the stage; connecting members for connecting the countermass to the stage; a pulley for supporting said connecting members; and an actuator for adjusting one of a tension force of and an effective length of the connection members.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1 is a schematic and front view of a vertical type stage system according to a first embodiment of the present invention.

FIGS. 10A and 10B are schematic views, respectively, for explaining a Y guide of FIG. 9, wherein FIG. 10A is a view for explaining bearing rigidity of the Y guide and FIG. 10B shows a section of the Y guide.

FIG. 20 is a schematic and perspective view of a stage system in an eighth embodiment of the present invention.

FIG. 21 is a schematic view for explaining an actuator of the FIG. 20 embodiment.

FIG. 22 is a schematic view for explaining a rotary type static bearing used in a bearing portion for a pulley.

DESCRIPTION OF THE PREFERRED EMBODIMENTS

[Embodiment 1]

Figure 2:
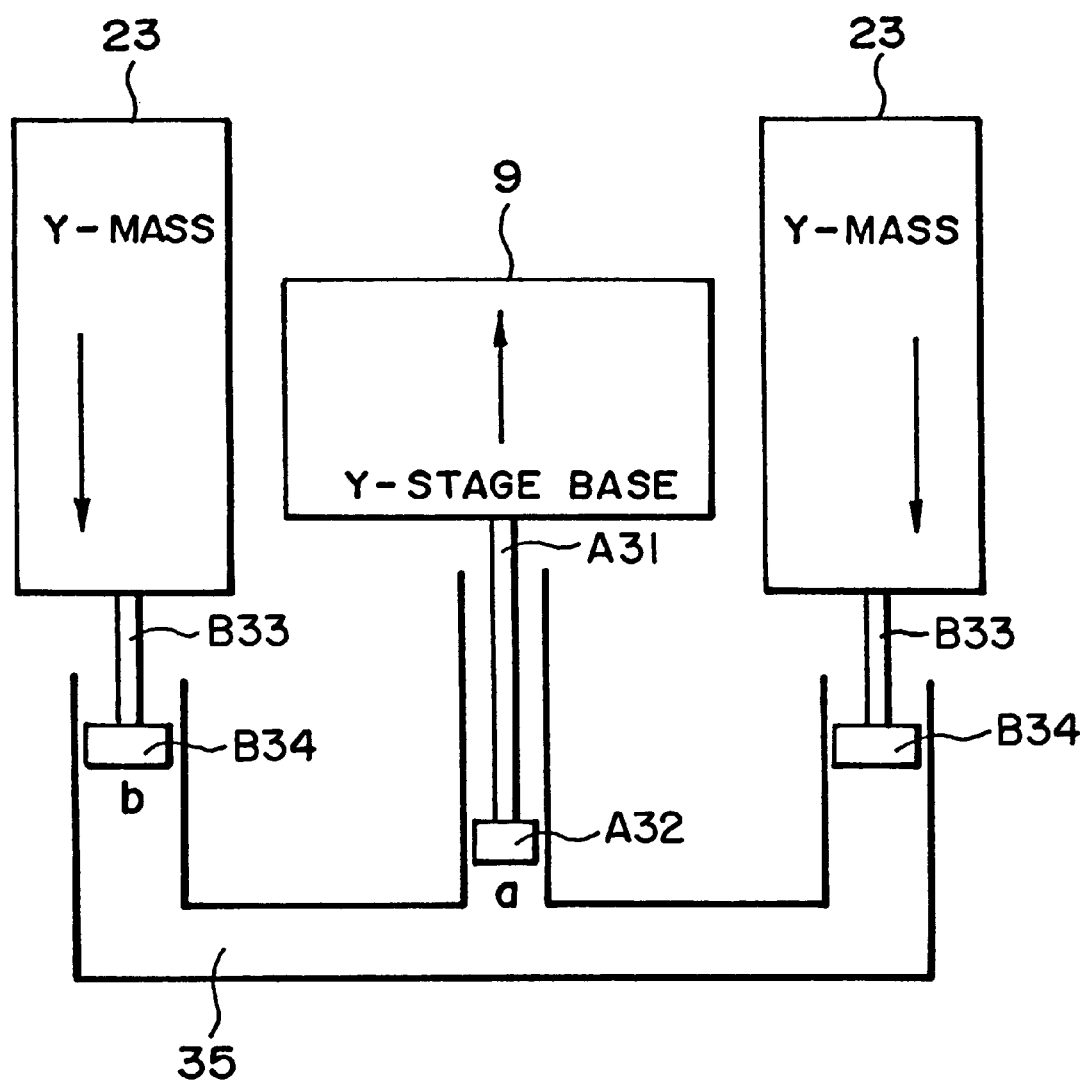
FIG. 2 is a schematic view of a model of a gravity compensation mechanism in the first embodiment of the present invention.

FIG. 1 is a schematic and front view of a vertical type stage system according to a first embodiment of the present invention. In this embodiment, the invention is applied to a vertical type X-Y stage which is incorporated into an X-ray exposure apparatus using synchrotron radiation, for supporting a wafer along a vertical direction and which is movable along the surface of the wafer. The X-Y stage system is provided with inertial force applying means and gravity compensating means.

Denoted in FIG. 1 at 1 is a base for supporting the vertical type stage system, and denoted at 2 is an anti-vibration damper for removing or reducing vibration of the base 1. Denoted at 3 is a stage base which is supported by the base 1 and which has a reference surface for supporting the stage system.

Denoted at 4 is a wafer chuck for holding a wafer thereon, and denoted at 5 is a main stage (second stage) for supporting the wafer chuck 4 and being movable along the wafer surface (X-Y plane). The main stage 5 has an X measurement mirror 6 and a Y measurement mirror 7 fixedly mounted at an end face thereof, for providing reflection surfaces for a position measurement beam.

Denoted at 8 is a Y stage guide fixedly mounted on the stage base 3, and denoted at 9 is a Y stage base (first stage) being movable in the Y direction with the main stage 5 mounted thereon. The Y stage guide 8 serves to support the Y stage base 9 with respect to the X direction (second direction) and to guide it with respect to the Y direction (first direction) without contact thereto.

Denoted at 10 is an X stage guide fixedly mounted on the Y stage base 9. It serves to support the main stage 5 with respect to the Y direction and to guide it with respect to the X direction without contact thereto.

This embodiment uses an air bearing mechanism for non-contact guiding. However, any other mechanism may be used, as long as it can provide a function of low friction guiding.

Denoted at 51 is a movable element of a linear motor (first driving mechanism) for providing a drive in the Y direction. It is fixedly mounted on the Y stage base 9, and is disposed opposed to a linear motor stator (not shown) mounted on the Y stage guide 8. The main stage 5 is provided with a movable element (not shown) of another linear motor (second driving mechanism) for providing a drive in the X direction. It is disposed opposed to an X linear motor stator 54, mounted on the X stage guide 10.

Preferably, these linear motors are set so that their operational axis, along which the thrust is applied, extends through the gravity center of the element to be driven thereby.

Denoted at 23 is a Y mass member (countermass) for applying an inertial force in the Y direction to the stage base 3. Denoted at 24 is a Y mass guide fixedly mounted on the stage base, for guiding the Y mass member 23 in the Y direction without contact thereto. As the Y mass member 23 moves in the Y direction, it functions as a Y-direction inertial force applying mechanism.

Denoted at 27 is an X mass member (secondary countermass) for applying an inertial force in the X direction to the stage base 3. Denoted at 28 is an X mass guide fixedly mounted on the Y stage base 9, for guiding the X mass member 27 in the X direction without contact thereto. As the X mass member 27 moves in the X direction, it functions as an X-direction inertial force applying mechanism.

Each of these masses is equipped with a movable element (not shown) of a linear motor for a drive in a predetermined direction, which is disposed opposed to the linear motor stator (not shown) provided on the corresponding guide, whereby an inertial force applying mechanism is provided. Preferably, these linear motors are set so that their operational axis, along which the thrust is applied, extends through the gravity center of the element to be driven thereby.

This embodiment is provided with means for compensating for gravity applied to the Y stage, which comprises a cylinder mechanism with a piston, in this embodiment.

Denoted in FIG. 1 at 31 is a cylinder rod (rod A) fixedly mounted on the Y stage base 9. An end thereof opposite to the Y stage base 9 is supported by a cylinder piston A32. Denoted at 33 is another cylinder rod (rod B) fixedly mounted on the Y mass member. An end thereof opposite to the Y mass member 23 is supported by a cylinder piston B34.

The pistons A32 and B34 have a sealing function for a fluid within an air cylinder 35 of a coupled structure. Thus, through the cylinder mechanism 35, the weight of the Y stage base 9 as supported by the piston A32 and the weight of the Y mass member 23 as supported by the piston B34 are propagated, and they are balanced with each other. As a result of this, gravity compensation for the Y stage base 9 is accomplished. Also, the cylinder 35 as well as the pistons A32 and B34 are maintained in a non-contact state, for example, to assure movement with very low friction.

Here, the weight of the Y stage base corresponds to total weight, including the main stage movable in the Y direction with the Y stage, the X stage guide, the X mass member, the X mass guide and the like. Similarly, the mass of the Y stage base corresponds to total mass, including an element movable in the Y direction with the Y stage base. Without mentioning otherwise, the same applies to other embodiments of the present invention to be descried later.

The sectional area of the piston of the cylinder mechanism 35 is determined in consideration of the weight of Y stage base 9 and the weight of Y mass member 23. Details of this will be described later.

A drive signal for the mass member is produced as follows. In the drawing, when the main stage 5 is to be driven in the X direction, the reaction force produced at the linear motor stator of the X stage guide as the main stage 5 is driven is denoted by $F_X$, while the resultant force of a reaction force produced at the stator of the linear motor of the X mass guide 28 as the X mass member 27 of the inertial force applying mechanism is driven is denoted by $R_X$. In order that the inertial force applying mechanism causes $R_X$ active to cancel $F_X$, the following equation should be satisfied.

$$R_X = -F_X$$

Here, if the inertial force applying mechanism is arranged so that the operational axis of $R_X$ is registered with the operational axis of drive reaction force $F_X$ of the main stage 5, no rotational torque is produced at the main stage 5. Further, providing plural X mass members 27 will be effective to broaden the latitude for designing the structure so that the operational axis of the drive thrust applied to the main stage 5 extends through the gravity center position. However, use of plural X mass members 27 is not a requisition.

Here, when the mass of the main stage is $M_X$ and the total mass of the X mass member 27 is $m_X$, the driving stroke $s_X$ for the X mass member 27 can be determined, with respect to the X-direction stroke $S_X$ of the main stage, by the mass ratio between $M_X$ and $m_X$. This can be expressed by an equation below.

$$S_X/s_X = 1/(M_X/m_X)$$

Namely, the ratio of movement amount of them displaces relative to the stage base 3, in a proportion corresponding to an inverse of the mass ratio. Thus, by making $m_X$ larger, the mass ratio $M_X/m_X$ becomes smaller and, therefore, the driving stroke $s_X$ of the X mass member can be designed small. Since, however, the Y-direction movement mass including the X mass member 27 becomes larger, the energy required for Y-direction movement becomes larger. To the contrary, if $s_X$ can be designed large, the mass $m_X$ of the X mass member 27 can be made smaller and, therefore, the Y-direction movement mass can be made smaller. Therefore, the energy required for Y-direction movement is made smaller.

The same applies to the Y direction. That is, as the Y stage base is driven in the Y direction, the Y mass member of the inertial force applying mechanism may be driven so as to cancel the reaction force produced at the Y stage guide 8. Since, however, there is a large influence of gravity, in regard to the Y direction, here, a description will be made only on the function of Y-direction driving means, similarly to the case of the X direction, on an assumption that a gravity compensating mechanism acting on the Y stage base 9 or Y mass member 23 is being operated such that the effect of gravity applied to the Y stage base 9 or the Y mass member 23 can be disregarded.

Here, the resultant force of a reaction force produced at the Y stage guide 8 fixed to the stage base 3 as the Y stage base 9 is to be driven in the Y direction is denoted by $F_Y$, while the resultant force of a reaction force produced at the Y mass guide fixed to the stage base as the Y mass member 23 of the inertial force applying mechanism is driven is denoted by $R_Y$. In order that the inertial force applying mechanism causes $R_Y$ active to cancel $F_Y$, the following equation should be satisfied.

$$R_Y = -F_Y$$

Here, if the inertial force applying mechanism is arranged so that the operational axis of $R_Y$ is registered with the operational axis of drive reaction force $F_Y$, no rotational torque is produced at the stage base 3. Further, providing plural Y mass members 23 will be effective to broaden the latitude for designing the structure so that the operational axis of the drive thrust applied to the Y stage base extends through the gravity center position. However, use of plural Y mass members 23 is not a requisition.

Here, when the mass of the Y stage base 9 is $M_Y$ and the total mass of the Y mass member 23 is $m_Y$, the driving stroke $s_Y$ for the mass member can be determined, with respect to the Y-direction stroke $S_Y$ of the Y-direction movement element, by the mass ratio between $M_Y$ and $m_Y$. This can be expressed by an equation below.

$$S_Y/s_Y = 1/(M_Y/m_Y)$$

Namely, the ratio of a movement amount of them displaces relative to the stage base 3, in a proportion corresponding to an inverse of the mass ratio. Thus, by making $m_Y$ larger, the mass ratio $M_Y/m_Y$ becomes smaller and, therefore, the driving stroke $s_Y$ of the Y mass member 23 can be designed small.

Next, the balancing relation between Y stage base 9 and Y mass member 23 by the cylinder mechanism 35 as well as the relation between piston sectional area and piston movement amount, will be described.

FIG. 2 shows a model of a cylinder mechanism which serves as a gravity compensating mechanism, in the first embodiment.

In the cylinder mechanism 35, when the sectional areas of the pistons A32 and B34 are denoted by a and b, respectively, the relation between the total mass $m_Y$ of the mass member 23 and the mass $M_Y$ of the Y stage base 9 supported by the piston A32 can be expressed by an equation below.

$$a/b = M_Y/m_Y$$

When the Y stage base 9 or the Y mass member 23 is supported by plural pistons, the amount a or b corresponds to the total of the piston sectional areas.

The ratio of movement amount between the pistons A32 and B34 whose sectional areas can be determined in accordance with the above equation, can be determined by an equation below, where $S_P$ is the movement amount of piston A32 and $s_P$ is the movement amount of piston B34.

$$S_P/s_P = 1(a/b)$$

Namely, the sectional area ratio a/b of the piston A32 for supporting the weight of the Y stage base 9 and of the piston B34 for supporting the weight of the Y mass member 23, corresponds to an inverse of the movement amount ratio between the Y stage base 9 and the Y mass member 23.

From these equations, it is seen that the movement amount ratio $(S_Y/s_Y)$ of the Y mass member 23 and the Y stage base 9, constituting the stage system of this embodiment, and the movement amount ratio $(S_P/s_P)$ of the pistons A32 and B34 of the piston mechanism (gravity compensating mechanism) are equal to each other. Because the movement amount ratio is the same, the Y mass member 23 and the Y stage base 9, constituting the inertial force applying mechanism can be connected to the gravity compensating mechanism through the cylinder rods A31 and B33. As a result, with a simple structure, both the inertial force applying mechanism and the gravity compensating mechanism are accomplished in parallel.

Here, the ratio in sectional area of the pistons A32 and B34 is approximately equal to the mass ratio of the Y stage base 9 and the Y mass member 23.

While in this embodiment air is used as the medium within the cylinder, this is not a requisition. A hydraulic cylinder, for example, may be used, as long as a similar function is provided.

In this embodiment, a drive reaction force due to drive of the main stage in the X direction is reduced by movement of the X mass member and, as a result, application of vibration to be applied to the base or the stage base can be reduced. Additionally, since the main stage and the X mass member move in opposite directions with respect to the X direction, at a proportion corresponding to an inverse of the mass ratio, advantageously, there occurs substantially no shift of a gravity center position of the whole stage system. Therefore, deformation of the base which supports the stage base can be suppressed. Particularly, in a vertical type stage such as of the present embodiment, suppression of a shift of gravity center position or of a change in reaction force with respect to the X direction, is very effective to a high speed and high precision stage system, since it reduces a change in load applied to an anti-vibration damper.

Further, in this embodiment, reaction force resulting from drive of the Y stage base in the Y direction is reduced by movement of the Y mass member and, as a result, application of vibration to be applied to the base or the stage base can be reduced. Additionally, since the Y stage base and the Y mass member move in opposite directions with respect to the Y direction, at a proportion corresponding to an inverse of the mass ratio, advantageously, there occurs substantially no shift of the gravity center position of the whole stage system. Therefore, deformation of the base which supports the stage base can be suppressed. Furthermore, since the weight of the Y stage base is compensated for by a cylinder mechanism of a coupled structure, both the inertial force applying mechanism and the gravity compensating mechanism are accomplished in parallel, with a simple structure. Thus, stage driving can be performed with less energy and less heat generation.

[Embodiment 2]

Figure 3:
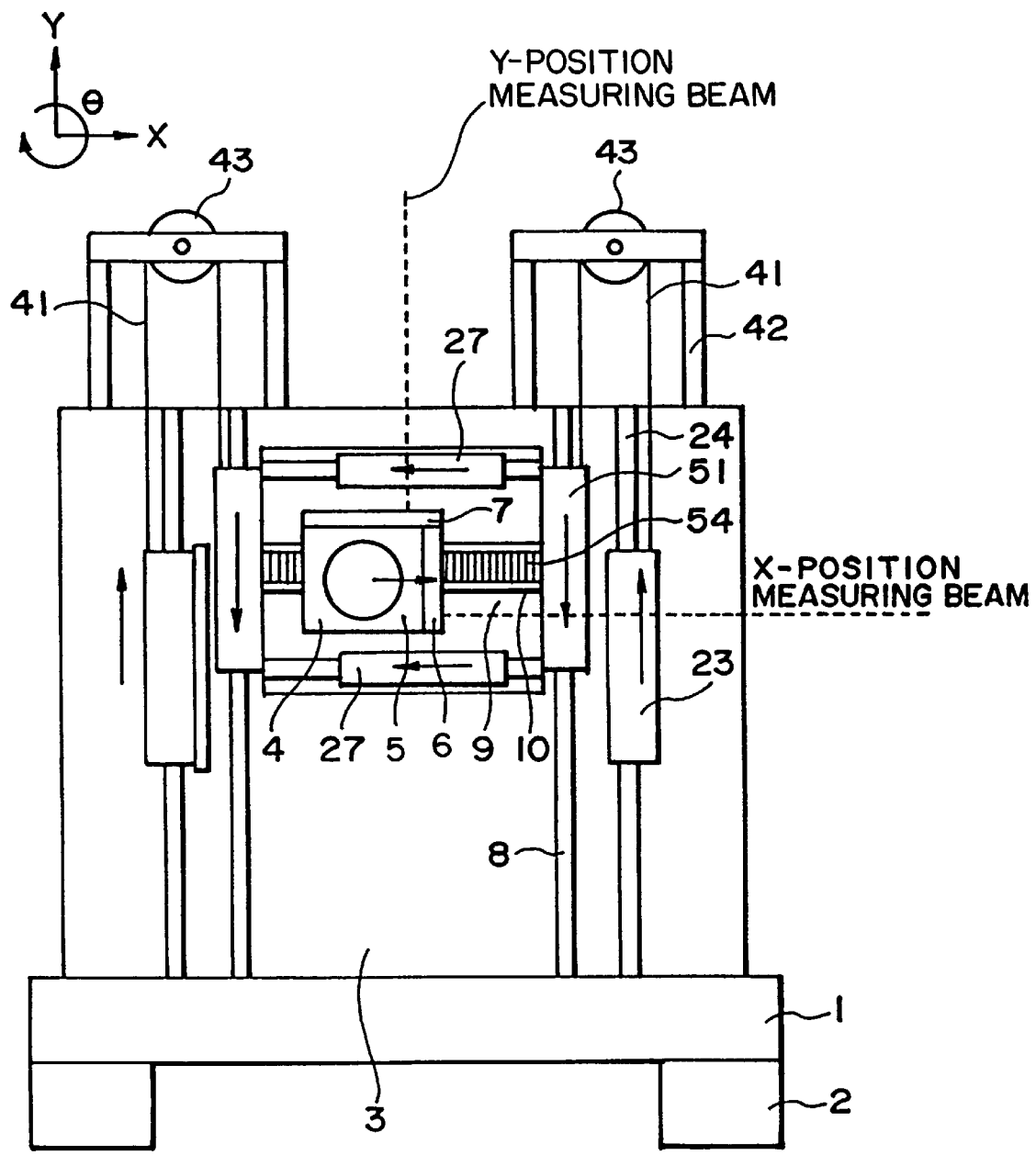
FIG. 3 is a schematic and front view of a vertical type stage according to a second embodiment of the present invention.

FIG. 3 is a schematic and front view of a vertical type stage system according to a second embodiment of the present invention. The components corresponding to those of the first embodiment of FIG. 1 are denoted by the same reference numerals.

Like the first embodiment, the second embodiment is applied to a vertical type X-Y stage system which is equipped with an inertial force applying mechanism and a gravity compensating mechanism.

The principle of operation and the manner of operation of the main stage or inertial force applying mechanism of the second embodiment are essentially the same as those of the first embodiment, and a description therefor will be omitted.

In the second embodiment, gravity compensation is provided by a pulley and belt mechanism, in place of the gravity compensation mechanism having a cylinder mechanism.

Denoted in FIG. 3 at 41 is a belt from which a Y mass member 23 and a Y stage 9 are suspended. Denoted at 42 is a fixed table which is fixedly mounted on a stage base 3. Denoted at 43 is a pulley unit disposed on the fixed table 42. As seen from the drawing, since the belt 41 is wound around the pulley unit 43, the pulley unit 43 functions to support the Y stage base 9 and the Y mass member 23 through the belt 41.

Figure 4:
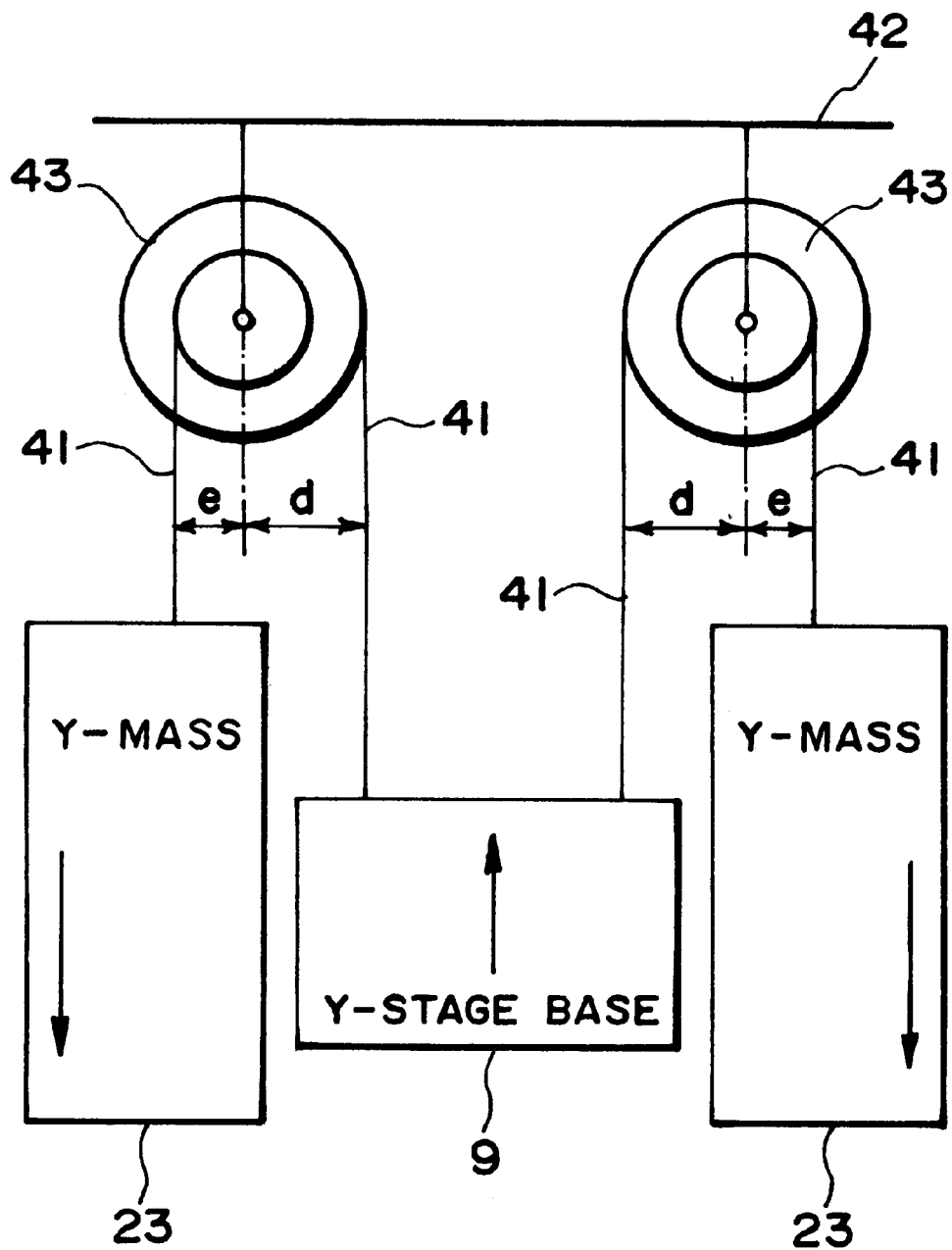
FIG. 4 is a schematic view of a model of a gravity compensation mechanism in the second embodiment of the present invention.

FIG. 4 shows a model of a pulley unit which is a gravity compensating mechanism, in the second embodiment.

Since the pulley unit 43 comprises pulleys each having two diameters, use of two belts is necessary for each pulley. An end of the belt 41 is fixed to the pulley, and an end of the other belt is attached to the Y stage base 9 or Y mass member 23.

In the second embodiment, particularly in regard to the ratio of pulley diameters of the pulley unit 43, the balance of weight between the Y stage base 9 and the Y mass member 23 as well as the relation between the movement amount of Y stage base 9 and Y mass member 23 and the pulley diameter, will be described.

Here, the mass of the Y stage base 9 is $M_Y$ and total mass of the Y mass member 23 is $m_Y$. In the pulley unit 43, the diameter of the pulley on which the belt 41 coupled to the Y stage base 9 is wound is d, and the diameter of the pulley on which the belt 41 coupled to the Y mass member 23 is wound is e. In this case, for balancing the weight of Y stage base 9 and Y mass member 23 with the pulley unit 43, the pulley diameter ratio d/e of the pulley unit 43 is determined in accordance with the mass ratio $M_Y/m_Y$, and it can be expressed by an equation below.

$$d/e = 1/(M_Y/m_Y)$$

Namely, the ratio of pulley diameters of the pulley unit 43 corresponds to an inverse of the mass ratio between the Y mass member 23 and the Y stage base as supported by the pulleys.

Here, the movement amount $S_P$ of the Y stage base 9 and the movement amount $s_P$ of the Y mass member 23 as the pulleys are arranged with this pulley diameter ratio, are proportional to the diameters of the pulleys to which they are connected, respectively. Thus, they are expressed by an equation below.

$$S_P/s_P = d/e$$

From these equations, it is seen that the movement amount ratio $(S_Y/s_Y)$ of the Y mass member 23 and the Y stage base 9, constituting the stage system of this embodiment, and the movement amount ratio $(S_P/s_P)$ of the Y mass member 23 and the Y stage base 9 of the gravity gravity compensating mechanism, comprising pulley unit 43, are equal to each other. Because the movement amount ratio is the same, the Y mass member 23 and the Y stage base 9, constituting the inertial force applying mechanism can be connected to the pulleys of the gravity compensating mechanism through the belt 41. As a result, with a simple structure, both the inertial force applying mechanism and the gravity compensating mechanism are accomplished in parallel.

While in this embodiment the gravity compensating mechanism uses a belt, this is not a requisition. A wire may be used, for example, as long as a similar effect is attainable.

When plural Y mass members 23 are used, preferably plural pulley units 43 for supporting the Y stage base 9 or Y mass member 23 may be used similarly.

In this embodiment, in addition to the effect of an inertial force applying mechanism of the first embodiment, there is an effect of the gravity compensating means comprising belts and pulleys that the drive reaction force resulting from drive of the Y stage base in the Y direction is reduced by movement of the Y mass member and, consequently, application of vibration to the base and the stage base is reduced. Furthermore, since the Y stage base and the Y mass member move in opposite directions with respect to the Y direction in a proportion corresponding to an inverse of the mass ratio of the Y stage base and the Y mass member, there occurs substantially no shift of gravity center position of the whole stage system. Therefore, deformation of the base for supporting the stage base can be suppressed. Additionally, by compensation of weight of the Y stage through pulleys and belts, the stage drive can be made with less energy and less heat generation.

[Embodiment 3]

Figure 5:
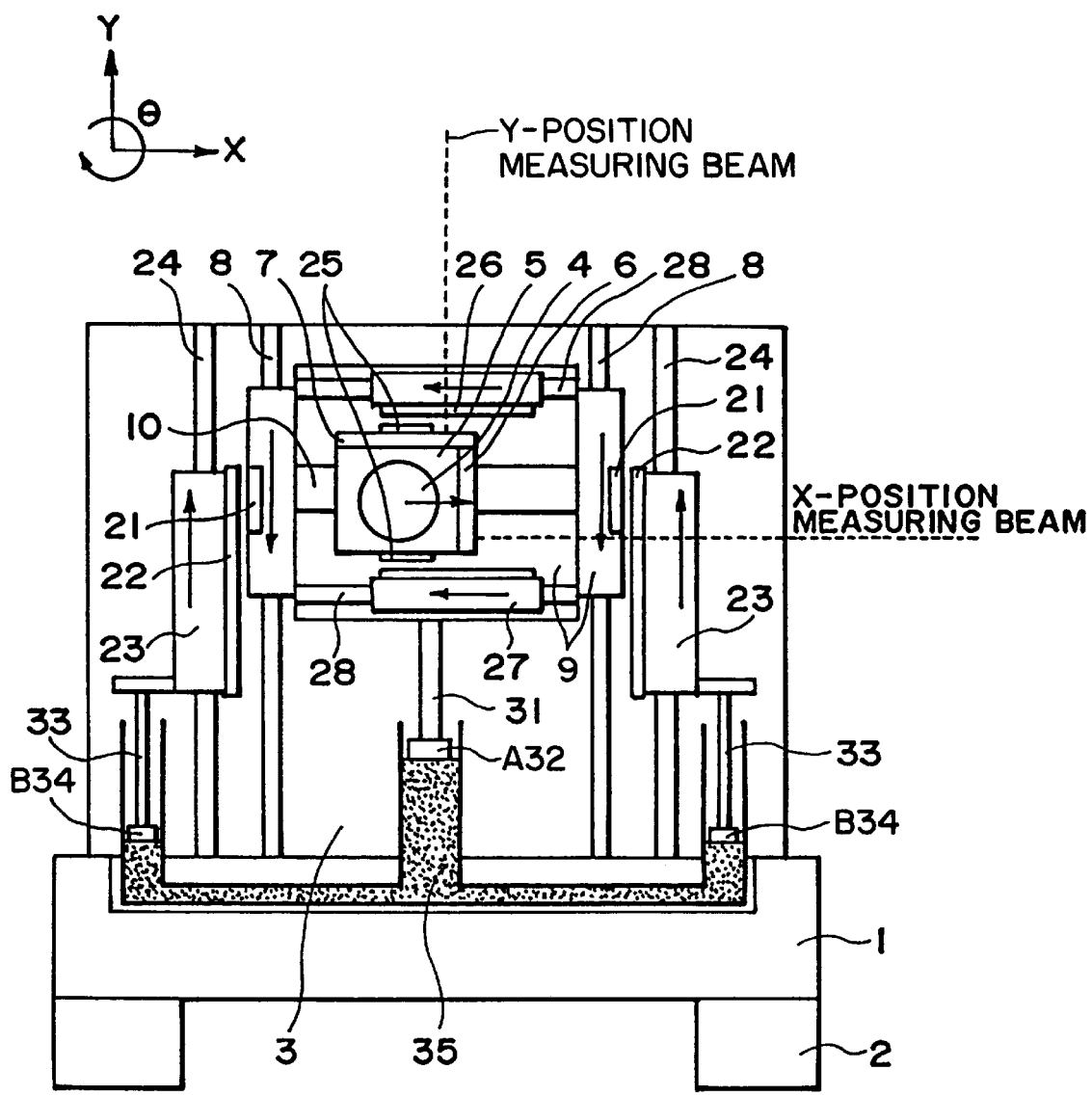
FIG. 5 is a schematic and front view of a vertical type stage system according to a third embodiment of the present invention.

FIG. 5 is a schematic and front view of a vertical type stage system according to a third embodiment of the present invention. The components corresponding to those of the first embodiment of FIG. 1 are denoted by the same reference numerals.

Like the first embodiment, the third embodiment is applied to a vertical type X-Y stage system which is equipped with an inertial force applying mechanism and a gravity compensating mechanism.

The principle of operation and the manner of operation of the gravity compensation mechanism of the second embodiment, comprising a cylinder mechanism, are essentially the same as those of the first embodiment, and a description therefor will be omitted.

In the third embodiment, in place of driving a main stage and an X mass member independently through linear motors mounted on them, respectively, the main stage and the X mass member are provided with an X magnet unit and an X coil unit by which driving in the X direction and inertial force application are accomplished. Also, as regards the Y direction, a Y magnet unit and a Y coil unit are provided on the Y stage base and the Y mass member, by which driving in the Y direction and inertial force application are accomplished.

Denoted in FIG. 5 at 1 is a base for supporting the vertical type stage system, and denoted at 2 is an anti-vibration damper for removing or reducing vibration of the base 1. Denoted at 3 is a stage base supported by the base 1, and by this stage base the stage unit is fixed.

Denoted at 4 is a wafer chuck for holding a wafer thereon, and denoted at 5 is a main stage (first stage) for supporting the wafer chuck 4 and being movable along the wafer surface (X-Y plane). The main stage 5 has an X measurement mirror 6 and Y measurement mirror 7 fixedly mounted at an end face thereof, for providing reflection surfaces for a position measurement beam.

Denoted at 8 is a Y stage guide fixedly mounted on the stage base 3, and denoted at 9 is a Y stage base (second stage) being movable in the Y direction (second direction) with the main stage 5 mounted thereon. The Y stage guide 8 serves to support the Y stage base 9 with respect to the X direction (first direction) and to guide it with respect to the Y direction without contact thereto.

Denoted at 10 is an X stage guide fixedly mounted on the Y stage base 9. It serves to support the main stage 5 with respect to the Y direction and to guide it with respect to the X direction without contact thereto.

This embodiment uses an air bearing mechanism for non-contact guiding. However, any other mechanism may be used, as long as it can provide a function of low friction guiding.

Denoted at 21 is a Y magnet unit (magnet of a first driving mechanism) mounted on the Y stage base 9. Denoted at 22 is a Y coil unit (second coil) mounted on the Y mass member 23 (countermass). Here, the Y magnet unit 21 and the Y coil unit 22 provide a linear motor (second mechanism) which functions as moving means. Thus, the Y magnet unit and the Y coil unit may be disposed reversely.

The Y mass member 23 is a mass member which is movable in an opposite direction to the Y stage base 9 with respect to the Y direction. Denoted at 24 is a Y mass guide fixedly mounted on the stage base, for guiding the Y mass member 23 in the X direction without contact thereto. As the Y mass member 23 moves in the Y direction, it functions as a Y-direction inertial force applying mechanism.

Denoted at 25 is an X magnet unit (magnet of a second driving mechanism) mounted on the main stage 5. Denoted at 26 is an X coil unit (coil of second driving means) mounted on the X mass member 27 (secondary countermass). Here, the X magnet unit 25 and the X coil unit 26 provide a linear motor (second mechanism) which functions as moving means. Thus, the X magnet unit and the X coil unit may be disposed reversely.

The X mass member 27 is a mass member which is movable in an opposite direction to the main stage 5 with respect to the X direction. Denoted at 28 is an X mass guide fixedly mounted on the Y stage base 9, for guiding the X mass member 27 in the X direction without contact thereto. As the X mass member 27 moves in the X direction, it functions as an X-direction inertial force applying mechanism.

Now, driving the main stage 5 in the X direction with the structure described above, will be explained. As a driving signal is applied to the X coil unit 26 through a drive controller (not shown), X direction thrust is produced between the X coil unit 26 and the X magnet unit 25. Since, however, the main stage on which the X magnet unit 25 is mounted and the X mass member 27 on which the X coil unit is mounted are both arranged to be movable in the X direction and, additionally, since they are guided without contact to minimize the friction, they move in opposite directions with respect to the X direction.

Here, the resultant force of thrust produced from the X magnet unit 25 for driving the main stage 5 is denoted by $F_X$, while the a resultant force of thrust produced from the X coil unit 26 for driving the X mass member 27 is denoted by $R_X$. From the relation of balance of force, the following equation applies.

$$F_X = -R_X$$

Here, if the X magnet unit 25 or the X coil unit 26 is arranged so that the operational axis of $R_X$ extends through the gravity center position of the main stage 5, then $F_X$ (main stage driving thrust) operates to pass through the gravity center position of the main stage 5. Thus, no rotational torque is produced at the main stage 5. Further, providing plural X mass members will be effective to broaden the latitude for designing the structure so that the operational axis of the drive thrust applied to the main stage 5 extends through the gravity center position. However, use of plural X mass members is not a requisition.

Here, when the mass of the main stage 5 is $M_X$ and the total mass of the X mass member 27 is $m_X$, the driving stroke $s_X$ for the X mass member 27 can be determined, with respect to the X-direction stroke $S_X$ of the main stage, by the mass ratio between $M_X$ and $m_X$. This can be expressed by an equation below.

$$S_X/s_X = 1/(M_X/m_X)$$

Namely, the ratio of movement amount of them displaces relative to the stage base 3, in a proportion corresponding to an inverse of the mass ratio. Thus, by making $m_X$ larger, the mass ratio $M_X/m_X$ becomes smaller and, therefore, the driving stroke $s_X$ of the X mass member can be designed small. Since, however, the Y-direction movement mass including the X mass member 27 becomes larger, the energy required for Y-direction movement can be made smaller.

The same applies to the Y direction. That is, as the Y stage base is driven in the Y direction, the Y mass member is driven. However, there is a large influence of gravity, in regard to the Y direction. Thus, here, a description will be made only on the function of Y-direction driving means, similarly to the case of the X direction, on an assumption that a gravity compensating mechanism acting on the Y stage base 9 or Y mass member 23 is being operated such that the effect of gravity applied to the Y stage base 9 or the Y mass member 23 can be disregarded.

As a driving signal is applied to the Y coil unit 22 through a drive controller (not shown), Y direction thrust is produced between the Y coil unit 22 and the Y magnet unit 21. Since, however, the Y stage 9 on which the Y magnet unit 21 is mounted and the Y mass member 23 on which the Y coil unit 22 is mounted are both arranged to be movable in the Y direction and, additionally, since they are guided without contact to minimize the friction, they move in opposite directions with respect to the Y direction.

Here, the resultant force of thrust produced from the Y magnet unit 21 for driving the Y stage base 9 is denoted by $F_Y$, while the resultant force of thrust produced from the Y coil unit 22 for driving the Y mass member 23 is denoted by $R_Y$. From the relation of balance of force, the following equation applies.

$$F_Y = -R_Y$$

Here, if the Y magnet unit 21 or the Y coil unit 22 is arranged so that the operational axis of $R_Y$ extends through the gravity center position of the whole Y direction movement components, including the main stage 5 and Y stage base 9, then $F_Y$ operates to pass through the gravity center position of the whole Y direction movement components. Thus, no rotational torque is produced at the stage. Further, providing plural Y mass members 23 will be effective to broaden the latitude for designing the structure so that the operational axis of the drive thrust applied to the Y stage base 9 extends through the gravity center position. However, use of plural Y mass members 23 is not a requisition.

Here, when the mass of the Y stage base 9 is $M_Y$ and the total mass of the Y mass member 23 is $m_Y$, the driving stroke $s_Y$ for the mass member can be determined, with respect to the Y-direction stroke $S_Y$ of the Y direction movement elements, by the mass ratio between $M_Y$ and $m_Y$. This can be expressed by an equation below.

$$S_Y/s_Y = 1/(M_Y/m_Y)$$

Namely, the ratio of movement amount of them displaces relative to the stage base 3, in a proportion corresponding to an inverse of the mass ratio. Thus, by making $m_Y$ larger, the mass ratio $M_Y/m_Y$ becomes smaller and, therefore, the driving stroke $s_Y$ of the Y mass member can be designed small.

In this embodiment, with the stage movement, the mass member is moved in an opposite direction to the stage. However, the relation between the movement amount of the stage and the movement amount of the mass member is similar to that of the first embodiment. Therefore, in the third embodiment, as in the first embodiment, the Y stage base 9 and the Y mass member 23, constituting the inertial force applying mechanism, can be connected to the gravity compensation mechanism through the cylinder rods A31 and B33. Thus, the inertial force applying mechanism and the gravity compensation mechanism can be accomplished in parallel, with a simple structure.

Here, the ratio of sectional area between the pistons A32 and B34 is substantially the same as the mass ratio between the Y stage base 9 and the Y mass member 23.

In this embodiment, a drive reaction force due to drive of the main stage in the X direction is reduced by movement of the X mass member and, as a result, application of vibration to be applied to the base or the stage base can be reduced. Additionally, since the main stage and the X mass member move in opposite directions with respect to the X direction, at a proportion corresponding to an inverse of the mass ratio, advantageously there occurs substantially no shift of gravity center position of the whole stage system. Therefore, deformation of the base which supports the stage base can be suppressed. Particularly, in a vertical type stage such as of the present embodiment, suppression of a shift of gravity center position or of a change in reaction force with respect to the X direction, is very effective to a high speed and high precision stage system, since it reduces a change in load applied to an anti-vibration damper.

Further, in this embodiment, a reaction force resulting from drive of the Y stage base in the Y direction is reduced by movement of the Y mass member and, as a result, application of vibration to be applied to the base or the stage base can be reduced. Additionally, since the Y stage base and the Y mass member move in opposite directions with respect to the Y direction, at a proportion corresponding to an inverse of the mass ratio, advantageously there occurs substantially no shift of gravity center position of the whole stage system. Therefore, deformation of the base which supports the stage base can be suppressed. Furthermore, since the weight of the Y stage base is compensated for by a cylinder mechanism of a coupled structure, both the inertial force applying mechanism and the gravity compensating mechanism are accomplished in parallel, with a simple structure. Thus, stage driving can be performed with less energy and less heat generation.

Further, in a case of an X-Y stage having a stage base reference surface extending horizontally, unlike the vertical stage of the present embodiment, the stage or mass member driving mechanism of this embodiment can be provided. On that occasion, the gravity compensating means of this embodiment may be omitted.

[Embodiment 4]

Figure 6:
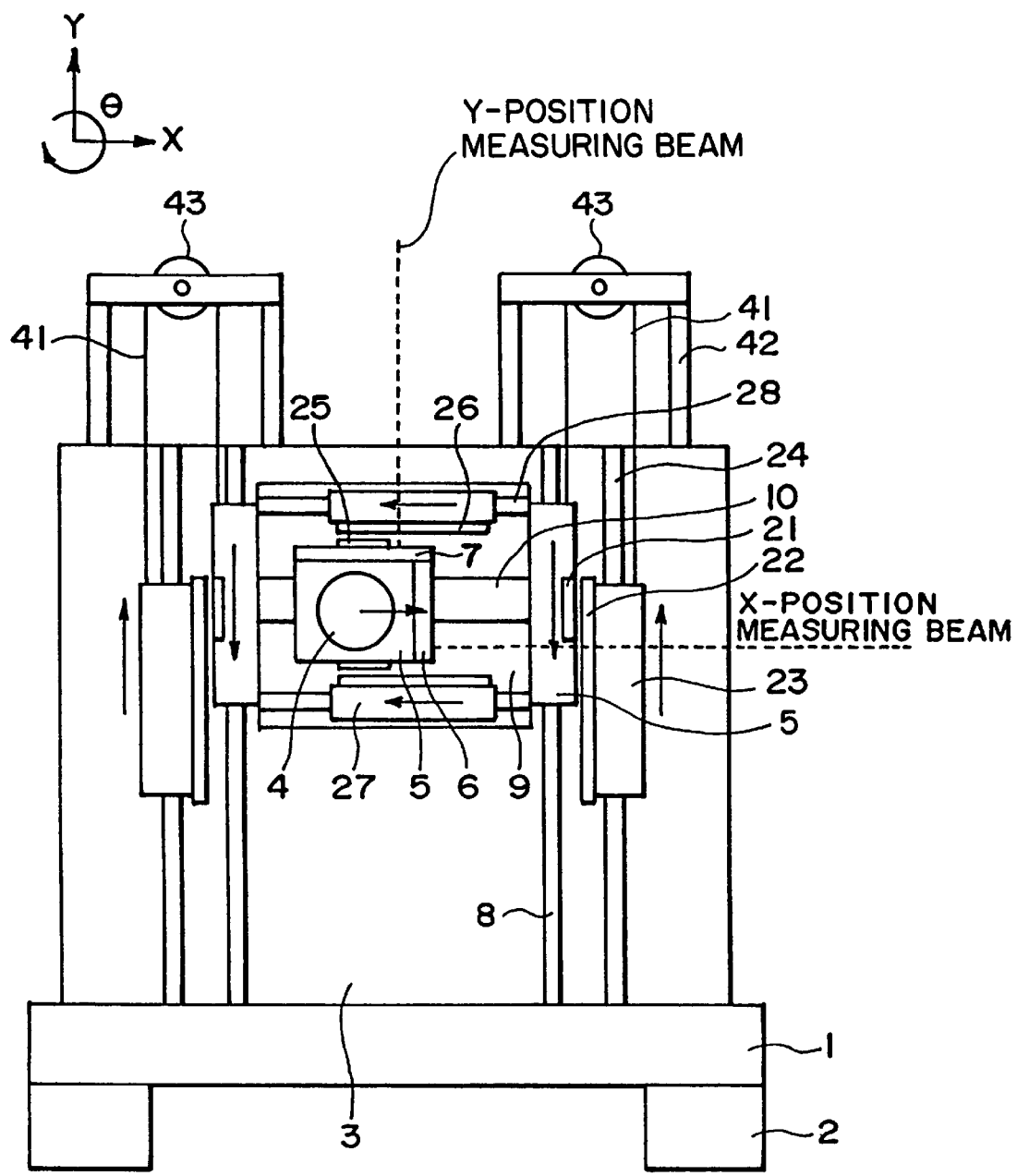
FIG. 6 is a schematic and front view of a vertical type stage system according to a fourth embodiment of the present invention.

FIG. 6 is a schematic and front view of a vertical type stage system according to a fourth embodiment of the present invention. The components corresponding to those of the second embodiment of FIG. 3 or of the third embodiment of FIG. 5 are denoted by the same reference numerals.

Like the preceding embodiment, the fourth embodiment is applied to a vertical type X-Y stage system which is equipped with an inertial force applying mechanism and a gravity compensating mechanism.

The principle of operation and the manner of operation of the inertial force applying mechanism of the fourth embodiment, comprising a magnet unit and a coil unit, are essentially the same as those of the third embodiment, and a description therefor will be omitted. Further, the principle of operation and the manner of operation of the gravity compensation mechanism, comprising a pulley unit 43 and a belt 41, are essentially the same as those of the second embodiment, and a description therefor will be omitted.

In this embodiment, a reaction force due to drive of the main stage in the X direction is reduced by movement of the X mass member and, as a result, application of vibration to be applied to the base or the stage base can be reduced. Additionally, since the main stage and the X mass member move in opposite directions with respect to the X direction, at a proportion corresponding to an inverse of the mass ratio, advantageously there occurs substantially no shift of gravity center position of the whole stage system. Therefore, deformation of the base which supports the stage base can be suppressed. Particularly, in a vertical type stage such as that of the present embodiment, suppression of a shift of gravity center position or of a change in reaction force with respect to the X direction, is very effective to a high speed and high precision stage system, since it reduces a change in load applied to an anti-vibration damper.

Further, in this embodiment, a reaction force resulting from drive of the Y stage base in the Y direction is reduced by movement of the Y mass member and, as a result, application of vibration to be applied to the base or the stage base can be reduced. Additionally, since the Y stage base and the Y mass member move in opposite directions with respect to the Y direction, at a proportion corresponding to an inverse of the mass ratio, advantageously there occurs substantially no shift of gravity center position of the whole stage system. Therefore, deformation of the base which supports the stage base can be suppressed. Furthermore, since the weight of the Y stage base is compensated for by a gravity compensation mechanism comprising belts and pulley units, both the inertial force applying mechanism and the gravity compensating mechanism are accomplished in parallel, with a simple structure. Thus, stage driving can be performed with less energy and less heat generation.

[Embodiment 5]

Figure 7:
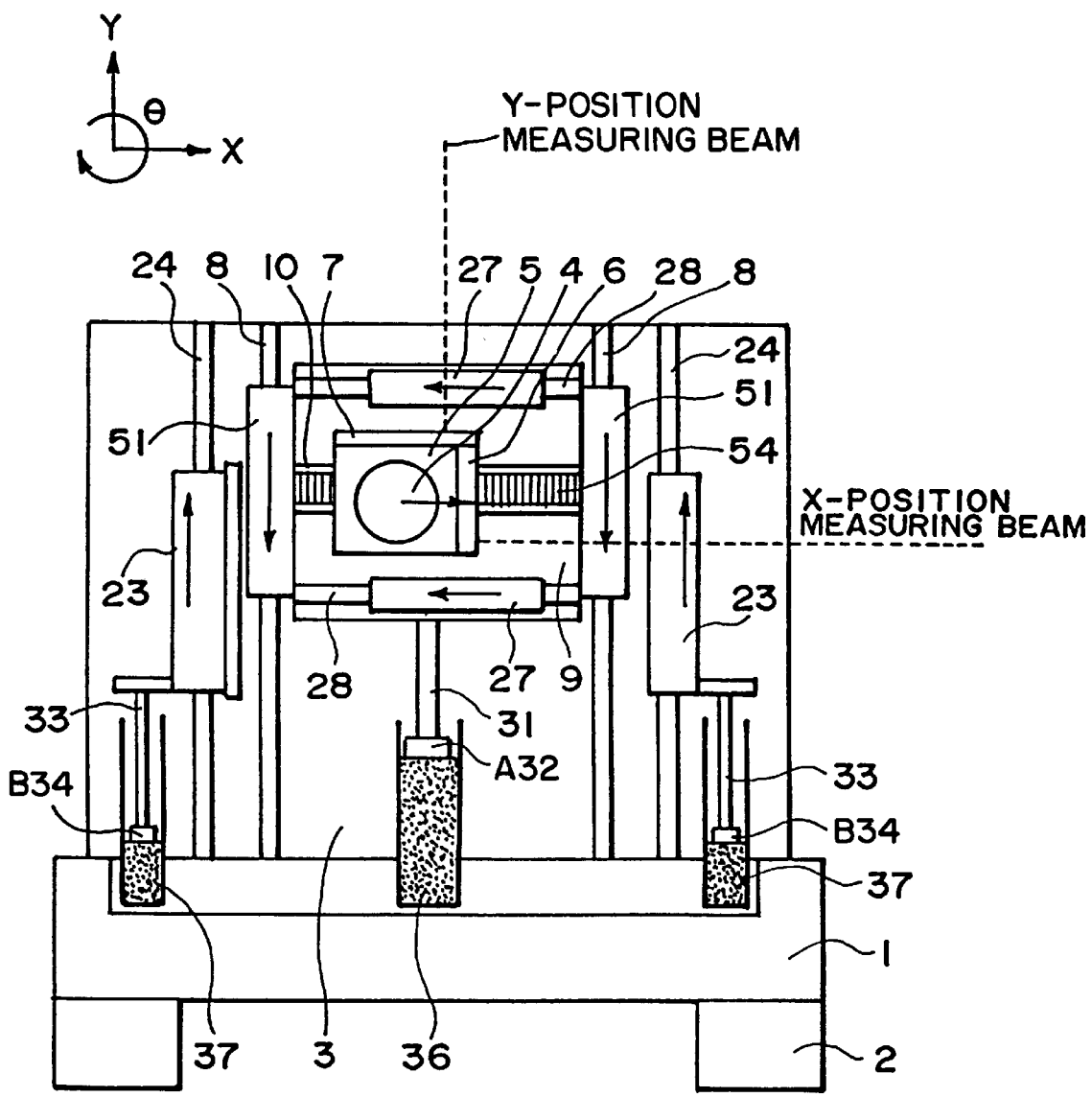
FIG. 7 is a schematic and front view of a vertical type stage system according to a fifth embodiment of the present invention.

FIG. 7 is a schematic and front view of a vertical type stage system according to a fifth embodiment of the present invention. The components corresponding to those of the first embodiment of FIG. 1 are denoted by the same reference numerals.

Like the first embodiment, the fifth embodiment is applied to a vertical type X-Y stage system which is equipped with an inertial force applying mechanism and a gravity compensating mechanism.

The principle of operation and the manner of operation of the inertial force applying mechanism of the fifth embodiment are essentially the same as those of the first embodiment, and a description therefor will be omitted.

This embodiment uses a cylinder mechanism with a piston, for the gravity compensation mechanism. However, as compared with the embodiment described hereinbefore, a piston for supporting the Y stage base and a piston for supporting the Y mass member are provided by independent cylinder mechanisms, such that gravity compensation for these members is performed separately.

Denoted in FIG. 7 at 31 is a cylinder rod (rod A) connected to the Y stage base. An end thereof opposite to the Y stage base 9 is supported by a cylinder piston A32. Denoted at 33 is a cylinder rod (rod B) connected to the Y mass member 23. An end thereof opposite to the Y mass member 23 is supported by a cylinder piston B34.

Piston A of the gravity compensation mechanism (stage gravity compensation mechanism) for performing gravity compensation for the Y stage base 9, provides a sealing function to the fluid within an air cylinder A36. A gravity compensation controller (not shown) calculates a thrust level to be applied to the cylinder A36, and a thrust level signal is applied to a control valve (not shown) of the cylinder. On the basis of an electric current corresponding to the designated thrust level, the control valve operates to change the pressure or volume of the fluid within the cylinder A, to thereby adjust the thrust of the piston A32. The piston A32 is connected to the cylinder rod A31, and it applies a Y direction thrust to the stage base 9. Through the control of thrust of the cylinder mechanism 36, the weight of the Y stage base 9 is balanced with the thrust of the cylinder A36.

Similarly, the piston B34 of the gravity compensation mechanism for performing gravity compensation for the Y mass member 23, provides a sealing function to the fluid within an air cylinder B37. On the basis of a thrust level designated by a gravity compensation controller (not shown), a control valve is controlled to change the pressure or volume of the fluid within the cylinder B, to thereby adjust the thrust of the piston B37. In this case, the weight of the Y stage base 9 is balanced with the thrust of the cylinder B37.

As a result, gravity compensation for the Y stage base 9 and the Y mass member is accomplished. The cylinder A and piston A as well as the cylinder B and piston B are maintained without contact, to assure movement with very low friction.

In this embodiment, the gravity compensation for the Y stage base and the gravity compensation for the Y mass member can be performed independently of each other. Therefore, the thrust of the piston of the cylinder mechanism performing the gravity compensation may be used as an energy for drive. Since the Y stage base and the Y mass member can be driven independently of each other, in addition to reduction of stage reaction force by the inertial force applying mechanism, there is an advantage that any vibration produced at the Y stage base due to external disturbance can be canceled. Further, there is no limitation to the sectional area ratio between the pistons A and B, as in the first embodiment. The latitude of design can be expanded more. Furthermore, it is possible to meet a change in mass of the Y stage base, when a wafer is placed on the stage.

[Embodiment 6]

Figure 8:
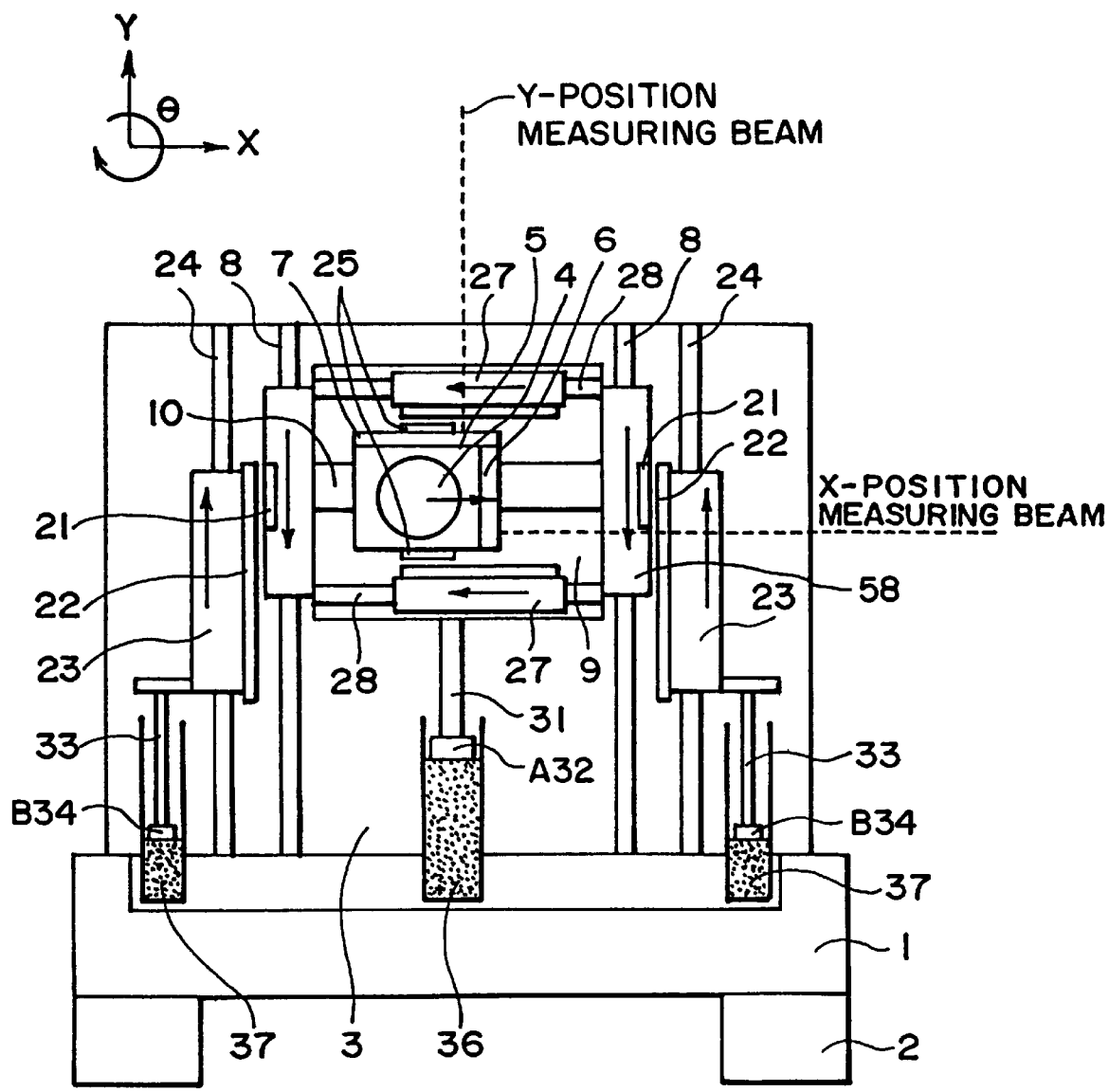
FIG. 8 is a schematic and front view of a vertical type stage system according to a sixth embodiment of the present invention.

FIG. 8 is a schematic and front view of a vertical type stage system according to a sixth embodiment of the present invention. The components corresponding to those of the third embodiment of FIG. 5 or of the fifth embodiment of FIG. 7 are denoted by the same reference numerals.

Like the preceding embodiment, the sixth embodiment is applied to a vertical type X-Y stage system which is equipped with an inertial force applying mechanism and a gravity compensating mechanism.

This embodiment comprises an X direction (second direction) inertial force applying mechanism having an X magnet unit 25 (magnet of a second driving mechanism) and an X coil unit 26 (coil of a second driving mechanism) mounted on the main stage 5 (second stage) and the X mass member 27 (secondary countermass), respectively, as well as a Y direction (first direction) inertial force applying mechanism having a Y magnet unit 21 (magnet of a first driving mechanism) and Y coil unit 22 (coil of a first driving mechanism) mounted on the Y stage base 9 (first stage) and the Y mass member 23 (countermass), respectively. The principle of operation and the manner of operation of these inertial force applying mechanisms are essentially the same as those of the third embodiment, and a description therefor will be omitted.

In accordance with this embodiment, in addition to the advantageous effects of the third embodiment, there is an advantage that, in regard to the pistons A and B for supporting the Y stage base and the Y mass member, there is no limitation to the sectional area ratio therebetween. Thus, the latitude of design can be expanded more. Furthermore, it is possible to meet a change in mass of the Y stage base, when a wafer is placed on the stage.

[Embodiment 7]

Figure 9:
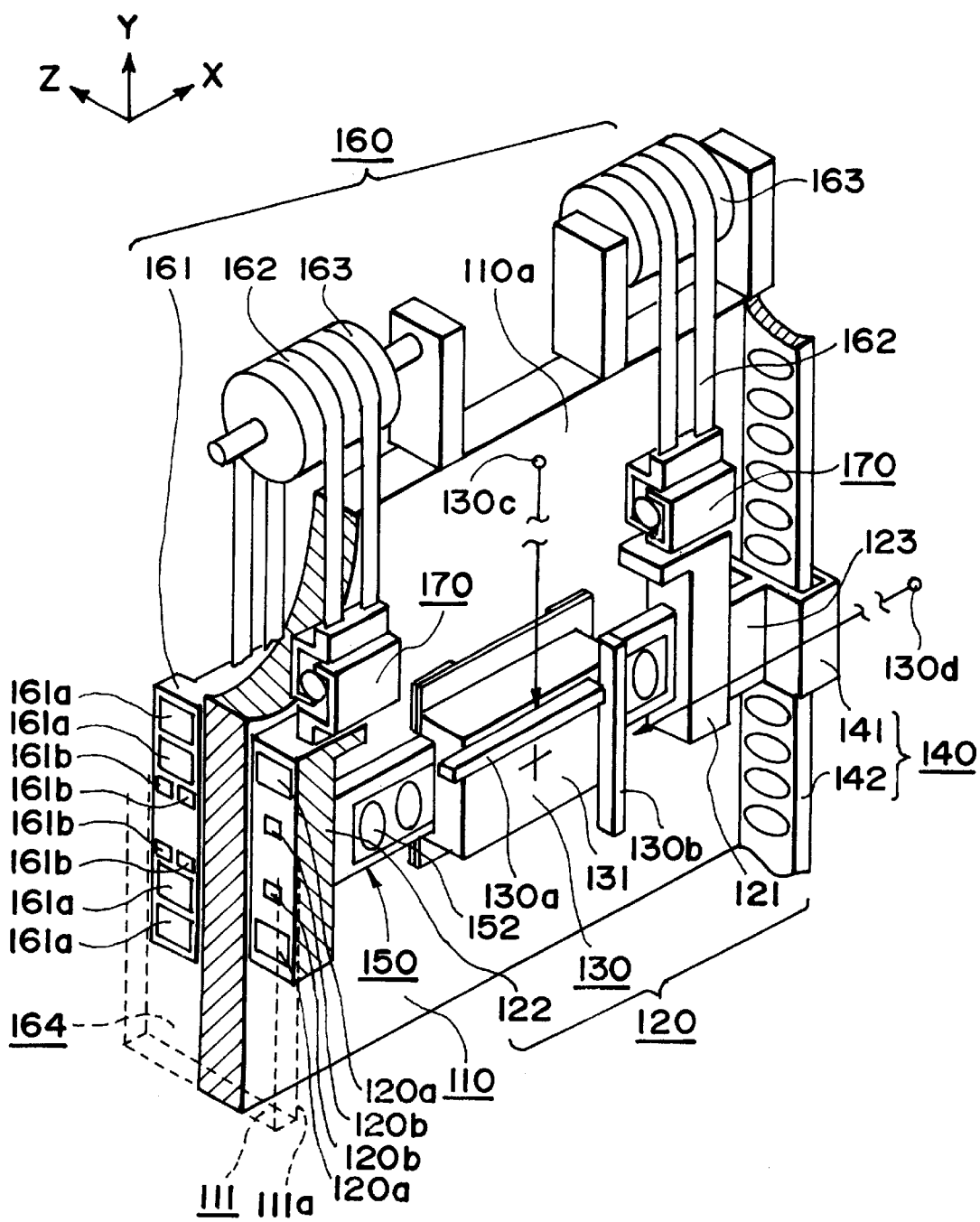
FIG. 9 is a schematic and front view of a stage system according to a seventh embodiment of the present invention.

FIG. 9 illustrates a stage system according to a seventh embodiment of the present invention. The stage system comprises an X-Y stage which includes: a Y stage 120 being reciprocally movable in the Y-axis direction (vertical direction or a direction close to it), along a stage base 110 mounted on a base plate (not shown); an X stage 130 being reciprocally movable in the X-axis direction along the Y stage 120; a pair of Y linear motors 140 which serve as first driving means for moving the Y stage 120 in the Y-axis direction; and an X linear motor 150 which serves as second driving means for moving the X stage 130 in the X-axis direction. In the illustration of FIG. 9, for explanation of a Y guide 111 (to be described later), one of the Y linear motors 140 placed at the left-hand side is omitted.

The stage base 110 has an X-Y guiding surface 110a which provides a reference surface, extending in a vertical direction or a direction close to it, for non-contact support of the bottom face of the X stage 130 and the Y stage 120 through a static bearing device (not shown) having air pads, for example. At an end of the stage base 110 in the X-axis direction, there is a Y guide 111 (broken line) which serves as a yaw guide for guiding the Y stage 120 in the Y-axis direction. The Y guiding surface 111a of the Y guide 111 and the Y stage 120 are kept out of contact with each other, by means of air pads 120a, for example, of the yaw guide static bearing device. When both of the Y linear motors 140 are actuated, the Y stage 120 moves along the Y guide 111, over the X-Y guiding surface 110a of the stage base 110.

Figure 10A:
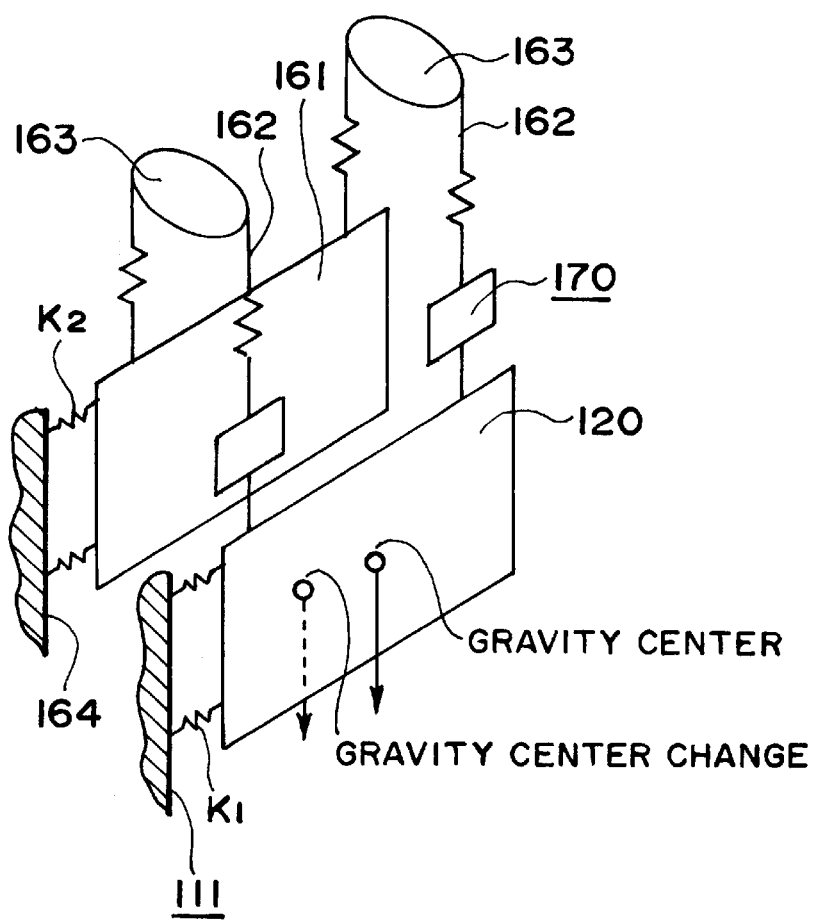
Figure 10B:
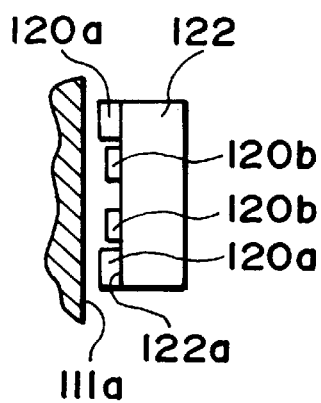

The Y stage 120 is provided by a frame-like structure comprising a pair of Y sliders 121 and 122 as well as an X linear motor stator 152 having opposite ends supported by the sliders. The bottom faces of these Y sliders 121 and 122 are opposed to the X-Y guiding surface 110a of the stage base 110, and they are supported without contact, by means of the air pads, for example, as described above. The length of the Y slider 122 on the left-hand side as viewed in the drawing, is longer than the other. Its side face 122a is opposed to the Y guiding face 111a of the Y guide 111, and it is guided without contact, by use of air pads 120a (see FIG. 10B), for example, as described above. The Y sliders 121 and 122 are integrally connected to a Y linear motor movable element 141, through a connecting plate 123.

The X stage 130 comprises a hollow plate member having a top plate 131. An X linear motor stator 152 extends through this hollow portion of the X stage. The top face of the top plate 131 provides a work stage for holding, by attraction, a wafer (workpiece) not shown.

The Y linear motors 140 include Y linear motor movable elements 141, coupled integrally to the Y sliders 121 and 122, respectively, of the Y stage 120 through the connecting plate 123 as described, as well as Y linear motor stators 142 extending through apertures of them.

In response to an electric current applied to the Y linear motor stators 142, a thrust in the Y-axis direction is produced at respective Y linear motor movable elements 141, by which the Y stage 120 and the X stage 130 are moved in the Y-axis direction.

The X linear motor movable element for moving the X stage 130 in the X-axis direction, along the Y stage 120, is fixedly mounted on the inside face of the top plate 131.

In response to an electric current applied to the X linear motor stator 152, a thrust in the X-axis direction is produced at the X linear motor movable element, by which the X stage 130 is moved in the X-axis direction and along the Y linear motor stator 152.

A countermass mechanism 160 serves as a weight compensation mechanism for cancelling the weight of the Y stage 120, X stage 130 and the like. It comprises belts 162 which are connecting members having the Y sliders 121 and 122 (i.e., Y stage 120) suspended at one end and having a countermass 161 suspended at the other end, as well as pulleys 163 around which the belts are wound and supported. The weight of the countermass 161 is set so that it is balanced with the total weight of the whole stage movable components, including the Y stage 120, the X stage 130 and a wafer held thereby.

As the X stage 130 moves in the X-axis direction, the gravity center position of the stage movable elements including the Y stage 120 and the X stage 130 displaces. Thus, the balance of rotational moment about the Z axis (wZ-axis direction) changes. However, this moment cannot be supported only by t he countermass mechanism 160, and an excessively large load is applied to the Y guide (yaw guide) 111 of the Y stage 120.

In order to support such a large load, the rigidity of the Y guide 111 has to be enlarged. However, increasing the rigidity of the Y guide 111 necessitates enlargement in size of the Y guide 111, for example. This results in further enlargement in size and weight of the stage mechanism as a whole, and causes degradation of the dynamic characteristic of the stage. Finally, improvement of positioning precision or positioning speed is disturbed.

For the belt that connects the Y stage 120 and the countermass 161, generally a steel belt or steel wire is used. When the Y stage 120 moves, there occurs natural or proper vibration due to insufficiency of rigidity of the steel belt or the like. In addition to this, natural vibration of the countermass 161 itself is propagated through the belt 62 to the Y stage 120. These vibrations degrade the stage positioning precision considerably, and this is a large bar to improvement of the frequency response characteristic of the positioning control system.

Figure 13:
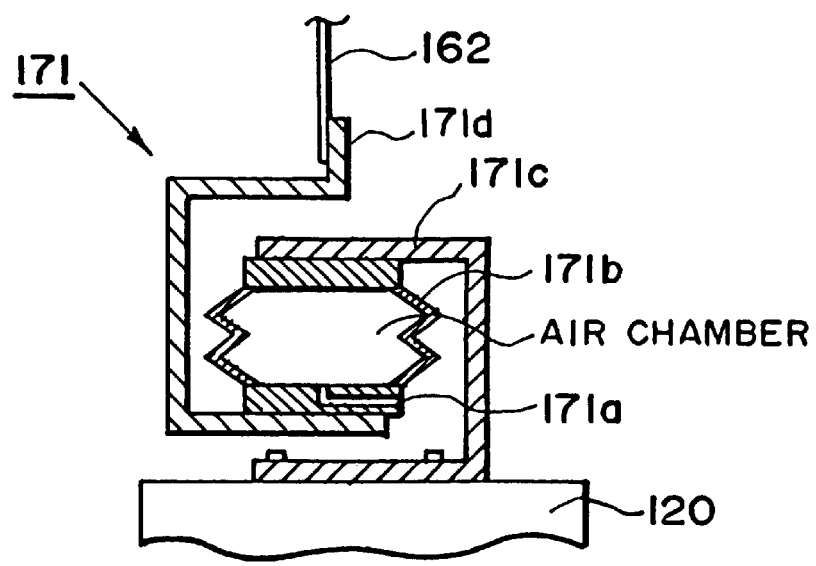
FIG. 13 is a schematic view for explaining an example where a bellowphragm is used as an actuator.
Figure 14:
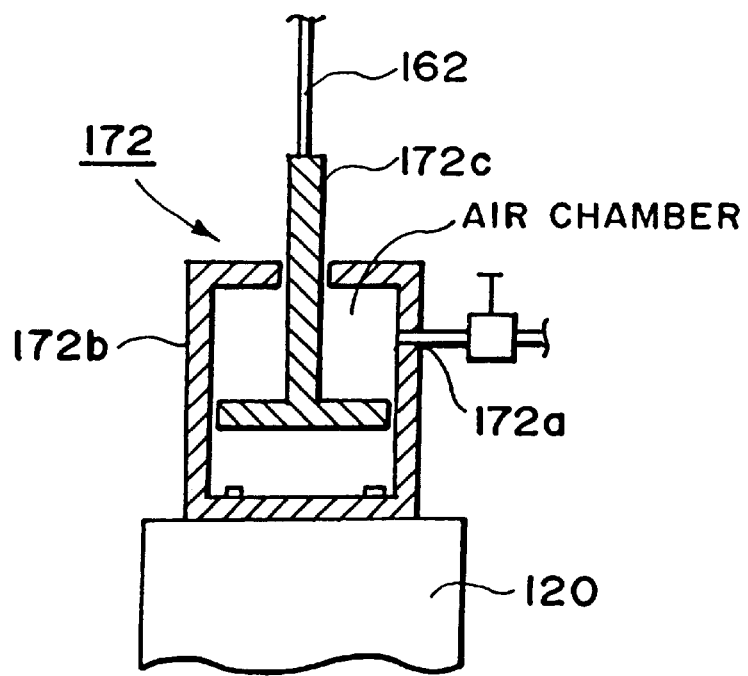
FIG. 14 is a schematic view for explaining an example where an air cylinder is used as an actuator.
Figure 15:
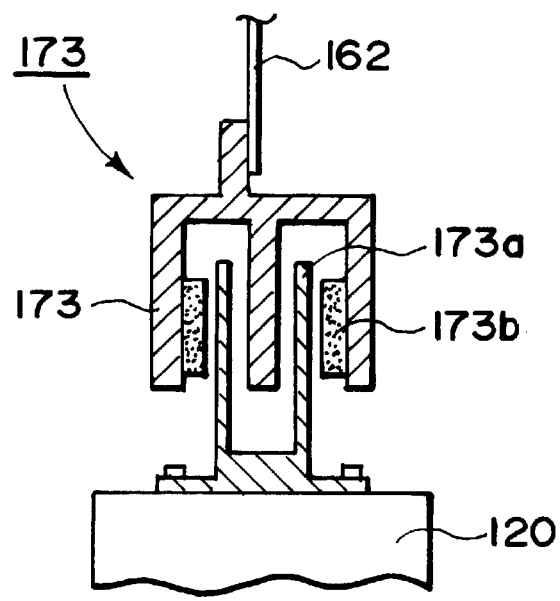
FIG. 15 is a schematic view for explaining an example where a linear motor is used as an actuator.

In order to avoid vibration propagation from the belts 162 to the Y stage 120 and also to totally solve the problems attributable to rotational moment as described, actuators 170 are provided at connections between the Y stage 120 and the belts 162, which actuators have a function as anti-vibration means and which are operable to adjust the tension or effective length of each belt 162 in accordance with the displacement of the X stage 130. As shown in FIGS. 13–15, each actuator 170 may comprise a bellowphragm (air spring) 171 for controlling the tension of the belt 162, an air cylinder 172, or a linear motor 173, for example. Alternatively, it may comprise a laminated or accumulated rubber member 174 (FIG. 16) which is an elastic member for resiliently coupling the belt 162 and the Y stage 120 with each other.

The drive amounts of the actuators 170 for respective belts 162, from which the Y sliders 121 suspend, are controlled independently of each other on the basis of the positional information regarding the X stage 130. By this, tension or effective length of each belt 162 can be adjusted. In this manner, a rotational moment produced with the movement of the X stage 130 can be canceled or compensated for and, by this, loads to be applied from the Y stage 120 to the Y guide 111 can be reduced.

The bellowphragm 171, the air cylinder 172 or the linear motor 173 has an anti-vibration function, and thus it serves to absorb and attenuate natural vibration resulting from insufficient rigidity of the belt 162, or natural vibration of the countermass 161. Namely, by means of the actuators 170, vibration propagation from the belts 162 to the Y stage 120 can be prevented, such that the positioning precision or frequency response characteristic of the positioning control system can be improved significantly.

Figure 16:
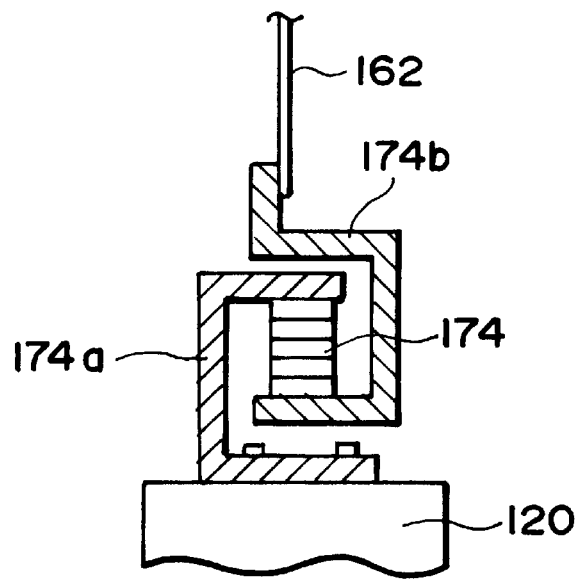
FIG. 16 is a schematic view for explaining an example where a laminated rubber member is used in place of an actuator.

The laminated rubber member 174 of FIG. 16 may not have an effect of rotational moment correction to the Y stage 120. However, it provides a function for effectively absorbing vibration to be propagated from the belt 162 to the Y stage 120.

As described above, the guiding face 111a of the Y guide 111 and the Y stage 120 (Y slider 122) opposed to it are kept without contact with each other, by means of the air pads 120a. In addition to the air pads 120a, the Y stage 120 is equipped with magnetic pads 120b which serve to apply a preload in an opposite direction to the air pads 120a, to thereby produce bearing rigidity $k_1$ shown in FIG. 10A.

Figure 11:
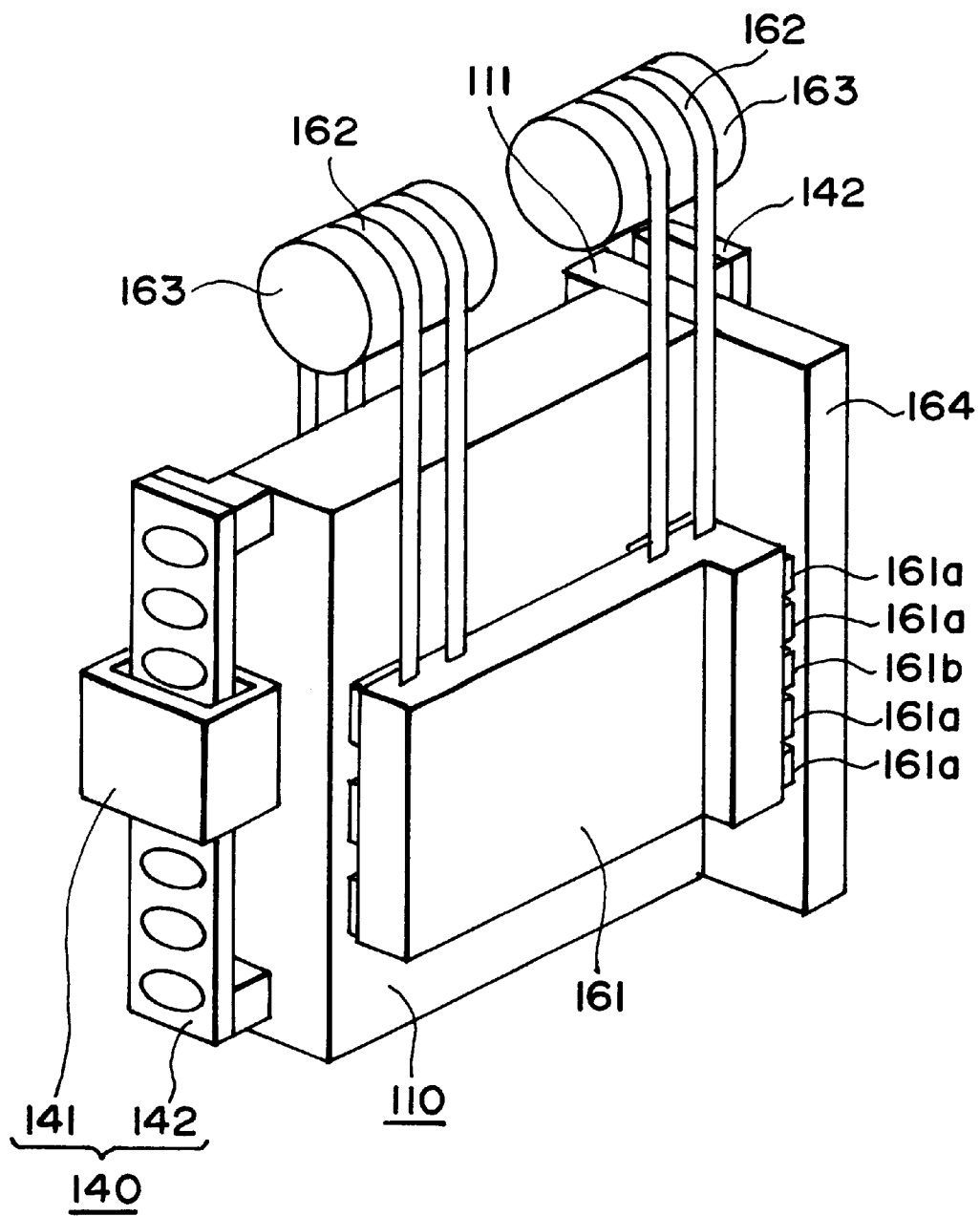
FIG. 11 is a schematic view of the stage system of the FIG. 9 embodiment, as viewed from the back thereof.

Further, as shown in FIG. 11, in parallel to the Y guide 111, there is a countermass yaw guide 164 at the back of the stage base 110. The countermass yaw guide 164 is disposed opposed to air pads 161a and magnetic pads 161b which serve as a countermass yaw guide static bearing device, provided at one end of the countermass 161. By means of these pads, the countermass 161 is guided in the Y-axis direction, without contact. The magnetic pads 161b of the countermass 161 serve to apply a preload in an opposite direction to the air pads 161a, whereby a bearing rigidity $k_2$ (FIG. 10A) which is larger than the bearing rigidity $k_1$ on the Y stage 120 side, is produced.

The bearing rigidity $k_2$ of the countermass yaw guide 164 is made larger than the bearing rigidity $k_1$ of the Y guide 111 as described. This is to assure that the influence of rotational moment, produced as the gravity center position of the Y stage 120 shifts with movement of the X stage 130 in the X-axis direction, is received by the countermass 164 to thereby reduce the rotational moment to be applied to the Y stage 120.

The position of the X stage 130 with respect to the Y-axis direction and X-axis direction can be measured by using position sensors 130c and 130d, respectively, for receiving reflection light from a Y measurement mirror 130a and an X measurement mirror 130b, integral with the X stage 130.

Next, a case where each actuator 170 comprises a bellowphragm 171 shown in FIG. 13, will be explained. The bellowphragm 171 includes a bellows 171b having an air supply port 171a. The upper end of the bellows 171b is coupled to a first housing 171c which is integral with the Y stage 120. The lower end of the bellows 171b is connected to a second housing 171d, connected to the lower end of the belt 162. By changing the pressure of air to be supplied to the air supply port 171a, the air pressure within the bellows 171b is changed, such that the tension of the belt 162 is changed.

Through the damper effect of the air pressure within the bellows 171b, vibration propagation from the belt 162 to the Y stage 120 can be effectively reduced or prevented.

Figure 17:
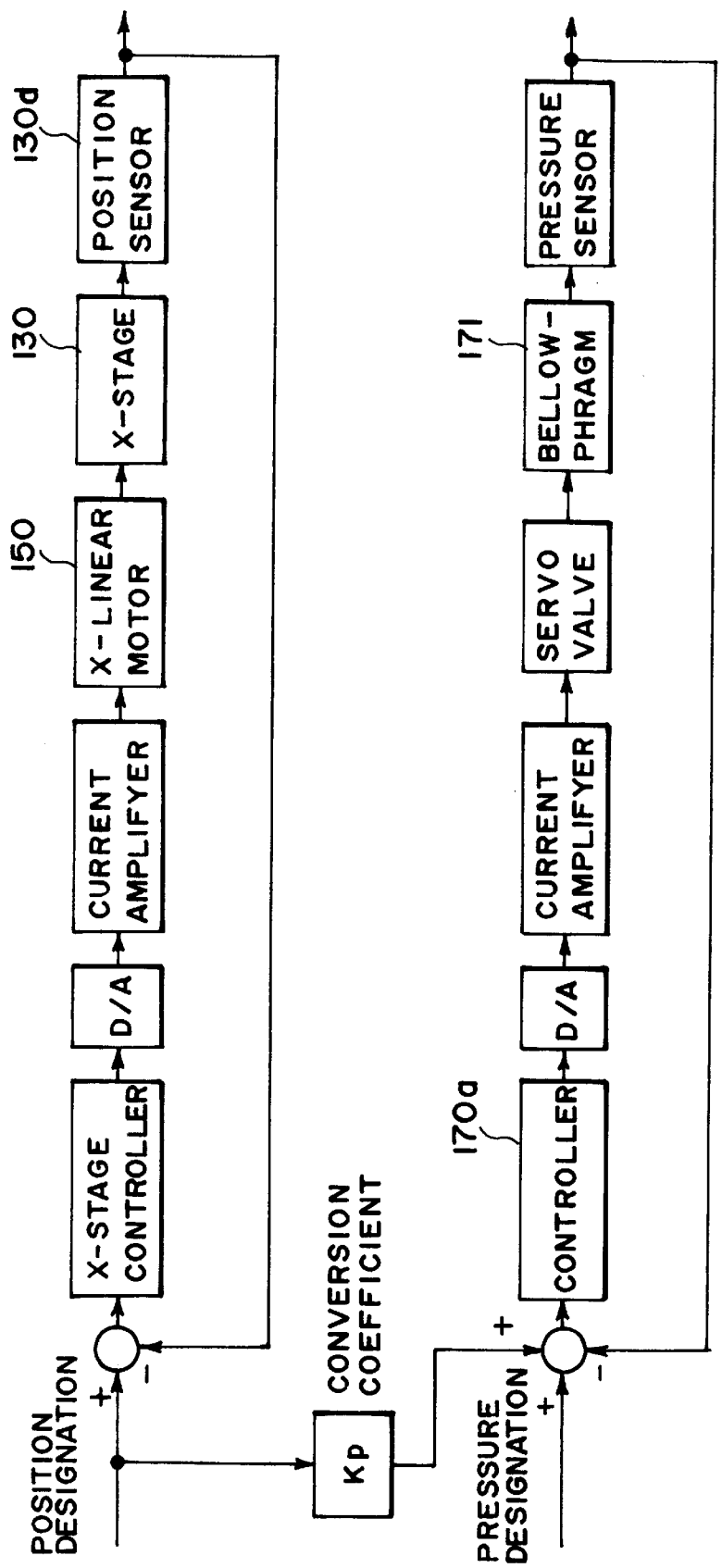
FIG. 17 is a block diagram of a control system for an actuator.

FIG. 17 is a block diagram of a control system for controlling the inside air pressure of the bellows 171b, on the basis of positional information of the X stage 130 in the X-axis direction. A servo system for controlling X linear motor 150 controls the drive amount of the X linear motor 150, on the basis of a position designation value supplied thereto from a computer (not shown) and of positional information of the X stage 130 in the X-axis direction as fed back from the position sensor 130d. The position designation value described above is kp (proportion) transformed, and the result is supplied to a controller 170a (control means) together with a pressure designation value of a bellowphragm control system. In response, a servo valve connected to the air supply inlet 171a of the bellowphragm 171 is adjusted, whereby the inside air pressure within the bellows 171b is controlled.

The position designation value of the X stage 130 is multiplied by a conversion coefficient kp and a pressure designation value of the bellowphragm control system is added. Then, as the gravity position of the stage movable portion shifts, inside pressure of each bellows 171 is changed to adjust the tension of each belt 162. In this manner, the tensions of belts 162 are adjusted individually. This produces a rotational moment opposite to the rotational moment, produced with the movement of the X stage 130. As a result, loads to be applied to the Y guide 111 are reduced.

Since the load applied to the Y guide 111 can be reduced remarkably through the moment correction described above, a dynamic characteristic of the stage can be improved largely without enlargement in size or weight of the Y guide 111. It is, therefore, possible to meet improvement of speed and precision of stepwise motion and positioning.

Next, an anti-vibration effect of the actuator 170 comprising bellowphragm 171, air cylinder 172 or linear motor 173, for example, or of an elastic member such as a laminated rubber member 174, will be explained in greater detail.

Figure 19:
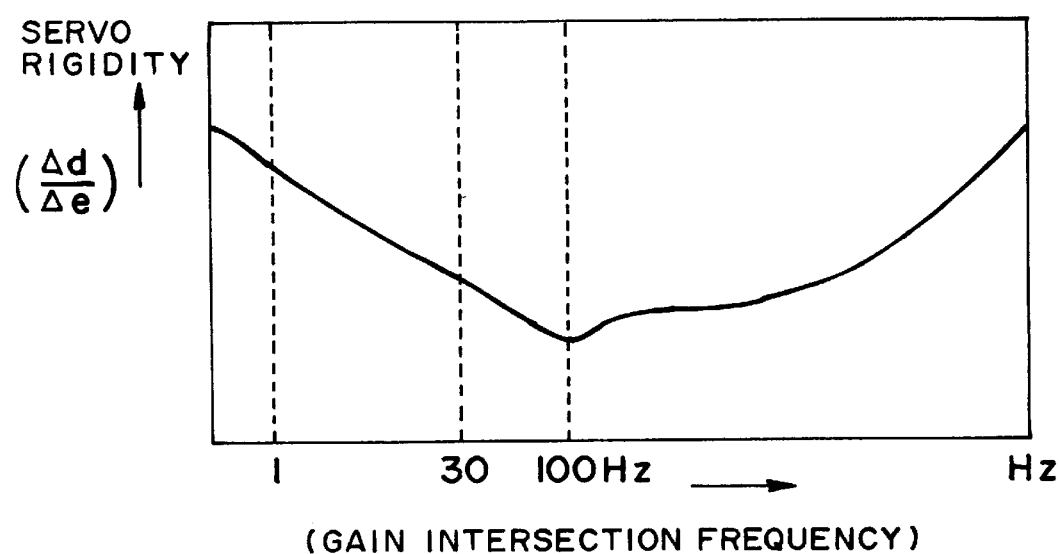
FIG. 19 is a graph for explaining a frequency characteristic of servo rigidity of a positioning control system.

In a positioning control system for controlling Y linear motor 140 or X linear motor 150 for driving the Y stage 120 or X stage 130, generally a PID (Proportion Kp, Integration Ki and Differentiation Kd) operation is performed, and, as shown in the graph of FIG. 19, gain adjustment is made so that the gain crossover frequency with which the servo rigidity Δd/Δe becomes lowest is set to about 100 Hz.

In a case where no actuator or no laminated rubber member is added, if, as a result of resonance of a belt and a countermass suspending therefrom, for example, vibration of 30 Hz enters the positioning control system as external disturbance, then, because of low servo rigidity about several tens of Hz (FIG. 19) the work stage for holding a wafer will be oscillated largely.

On the other hand, if vibration at several tens of Hz propagated from the belt is removed by using anti-vibration means such as an actuator or laminated rubber, only vibration of 1 Hz, for example, will be transmitted to the work stage. If there is only an external disturbance of a low frequency as a few Hz, because of high servo rigidity of the positioning control system, the dynamic characteristic would not be degraded.

Improving the dynamic characteristic of a small size and high performance stage system largely as described above, significantly contributes to reduction in size and enhancement of performance and productivity of an exposure apparatus for the manufacture of semiconductor devices, for example.

When each actuator 120 comprises an air cylinder 172 (FIG. 14) in place of bellowphragm 171, the following applies. The cylinder 172b having an air supply port 172a is made integral with the Y stage 120. The belt 162 has its lower end connected to the piston 172c. By changing the pressure of air to be supplied to the air supply inlet 172a, the tension of the belt 162 is adjusted. A control system for controlling the air pressure of the cylinder 172b may be similar to that shown in FIG. 17.

When each actuator 170 comprises a linear motor 173 shown in FIG. 15, the following applies. The coil 173a of the linear motor 173 is integral with the Y stage 120, and the belt 162 has its lower end connected to a driving magnet 173b. By changing an electric current to be applied to the coil 173a, the tension of the belt 162 is adjusted. A control system for controlling the electric current to be supplied to the coil 173a may be similar to that of FIG. 17.

The laminated rubber member 174 shown in FIG. 16 has its upper end connected to a housing 174a which is integral with the Y stage 120. The lower end of the rubber member 174 is supported by a housing 174b, connected to the belt 162. Through elastic change in thickness of the laminated rubber member 174, vibration propagation from the belt 162 to the Y stage 120 is prevented.

In the structure shown in FIG. 16, the laminated rubber member 174 may be replaced by a piezoelectric device which can function as an actuator. On that occasion, the housing 174a supporting the upper end of the piezoelectric device may be integral with the Y stage 120, while a housing 174b for supporting the lower end of the piezoelectric device 174 may be connected to the lower end of the belt 162. By changing an electric voltage to be applied to the piezoelectric device, the thickness thereof is changed to adjust the effective length of the belt 162. A control system for controlling the electric voltage to be supplied to the piezoelectric device may be similar to that of FIG. 17.

It is to be noted that, even through rotational moment correction of the Y stage 120 by actuators 170 or through reduction of vibration propagation to the Y stage 120 through belts 162, it may be still difficult to completely avoid vibration propagation from the countermass 161 to the Y stage 120. While such vibration may be of a low frequency as a few Hz, for further improvement of positioning precision and for attainment of higher speed, it may be undesirable.

Figure 12:
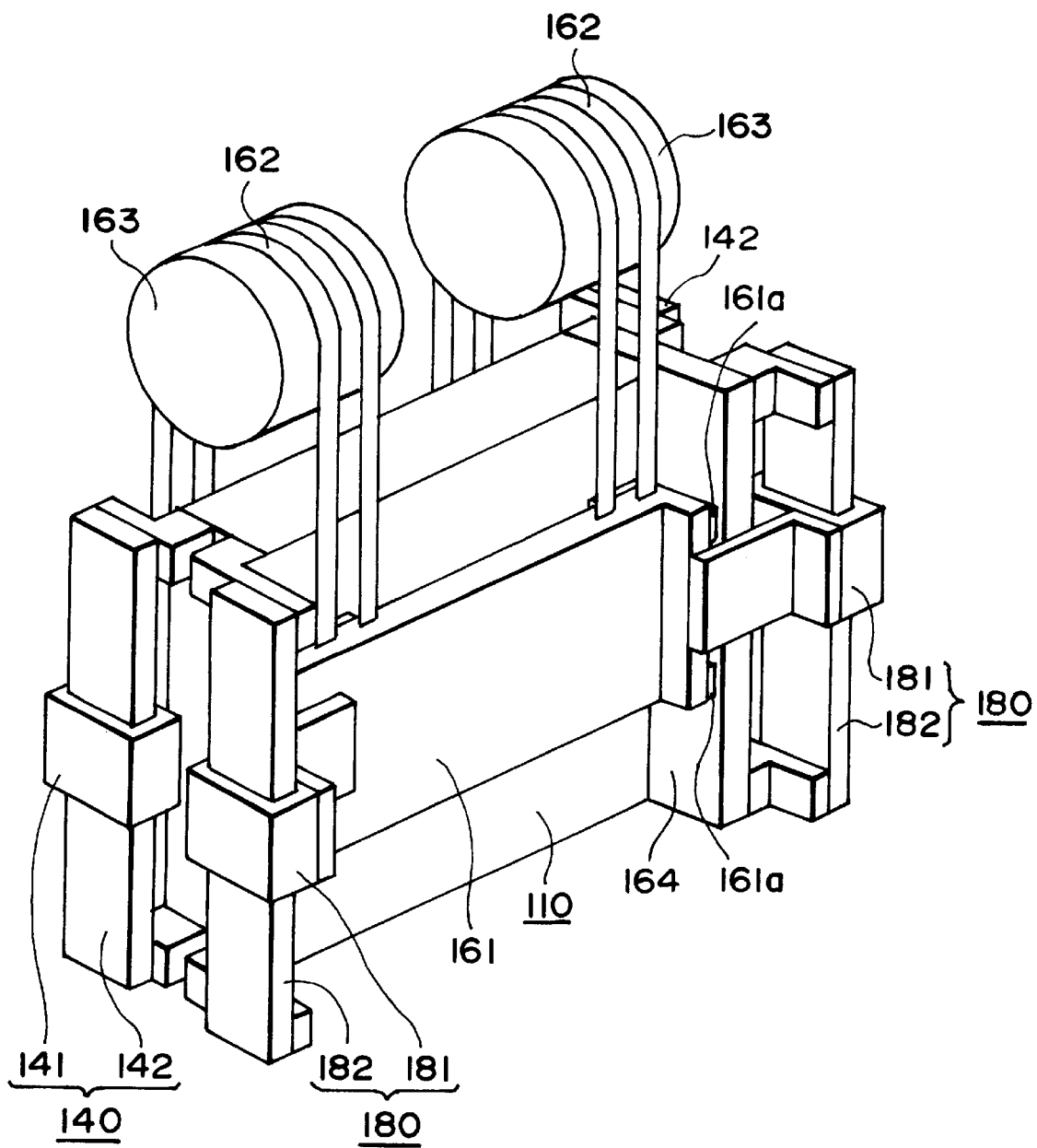
FIG. 12 is a schematic view of a modified form of the FIG. 11 embodiment.

In consideration of this, third driving means comprising a pair of linear motors 180 (FIG. 12) may preferably be added to accelerate the countermass 161 in an opposite direction to the Y stage 120, to thereby suppress the natural vibration of the countermass 161. The linear motors 180 may be provided at opposite ends of the countermass 161, and they may be disposed at the back of the Y linear motor 140 for moving the Y stage 120 in the Y-axis direction.

Each linear motor 180 is provided with a linear motor movable element 181 integral with the countermass 161, which element is movable along a linear motor stator 182 provided at a side edge of the stage base 110. By controlling electric current to be supplied to the linear motor stator 182, acceleration of the countermass 161 in the Y-axis direction can be adjusted to one having the same absolute value as and in an opposite direction to the acceleration as provided by the Y linear motor 140 to the Y stage 120. By doing so, it is possible to substantially completely remove external disturbance due to natural vibration of the countermass 161. A control system for the linear motor 180 for driving the countermass 161 will be described later with reference to the block diagram of FIG. 18.

Through attenuation of vibration propagation to the Y stage 120 from the countermass mechanism 160 including belts 162 by the actuators 170 and through reduction of natural vibration of the countermass 161, external disturbance of the control system of the Y stage 120 can be removed very effectively. This contributes to further improvement of positioning precision and positioning speed.

Figure 18:
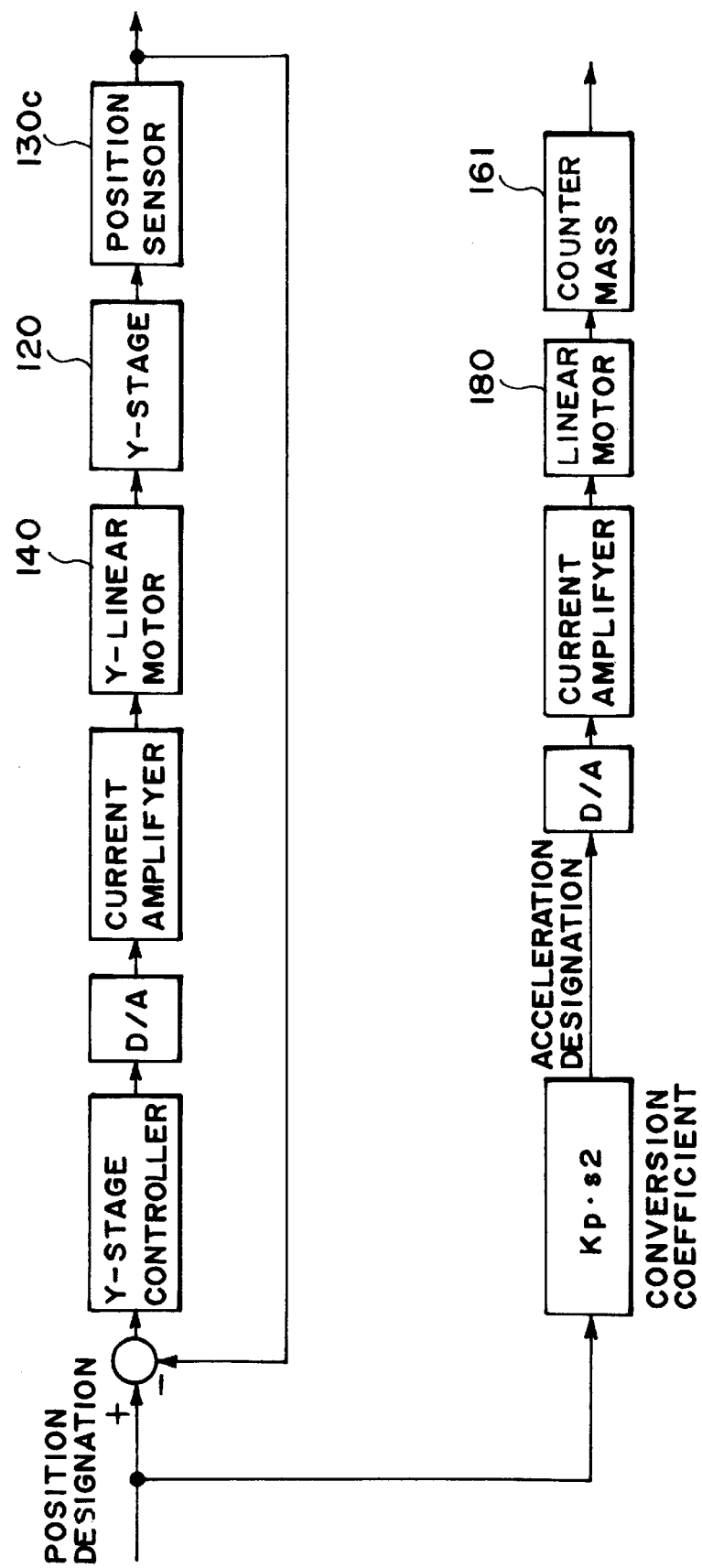
FIG. 18 is a block diagram of a control system for a linear motor, for driving a countermass.

FIG. 18 shows a control system for linear motors 180, for driving the countermass 161 in the Y-axis direction. A servo system for controlling the Y linear motor 140 controls the driving amount of the Y linear motor 140 on the basis of a position designation value as supplied from a computer (not shown) and of positional information of the Y stage 120 in the Y-axis direction as fed back from the position sensor 130c. Also, the position designation value is applied to the linear motor 180 of the countermass 161, as an acceleration designation value being twice differentiated and kp converted. Only with the addition of such a simple control system as described above, the driving amounts of the Y stage 120 and of the countermass 161 can be controlled synchronously.

[Embodiment 8]

FIG. 20 shows an eighth embodiment of the present invention. In this embodiment, in place of provision of actuators 170 at the connections between the Y stage 120 and the belts 162, actuators 180 are provided at the bearing portion (supporting portion) of pulleys 163 disposed at the top of the stage base 110. As shown in FIG. 21, each actuator 180 comprises bellowphragms 181 provided between the stage base 110 and a bearing base 163b on which a rolling bearing 163a for rotatably supporting the pulley 163 is mounted. The inside structure of the bellowphragm 181 may be similar to that of the bellowphragm 171 of FIG. 13. It is controlled with a control system similar to that of FIG. 17.

In place of the bellowphragm 181, an air cylinder, a linear motor, or a laminated rubber member such as shown in FIGS. 14–16 may be used.

As regards stage base 110, Y guide 111, Y stage 120, X stage 130, Y linear motor 140, X linear motor 150, countermass mechanism 160 and so on, they may be similar to those of the seventh embodiment. A description therefor will be omitted, by assigning corresponding reference numerals to them.

As described above, an actuator or elastic member (laminated rubber member) for adjusting the tension or effective length of the belt may be provided at the support of the pulley. Also, similar actuator means may be provided at the connection between the countermass and the belt at the back of the stage base, with a similar advantage of effective correction or prevention of rotational moment.

As a further alternative, in place of the rolling bearing 163a of FIG. 21, a rotary type static pressure bearing 190 shown in FIG. 22 may be used to rotatably support the pulley 163. The rotary type static bearing 190 comprises a pair of bearing members 190a for supporting the bearing portion of the pulley 163 with respect to a radial direction and a thrust direction, without contact thereto. It serves to resiliently change the height of the pulley 163 within the range as determined by the bearing gap 190b of the bearing member 190a. With the damper effect as described, vibration propagation from the belt 162 to the Y stage 120 can be prevented.

[Embodiment 9]

Figure 23:
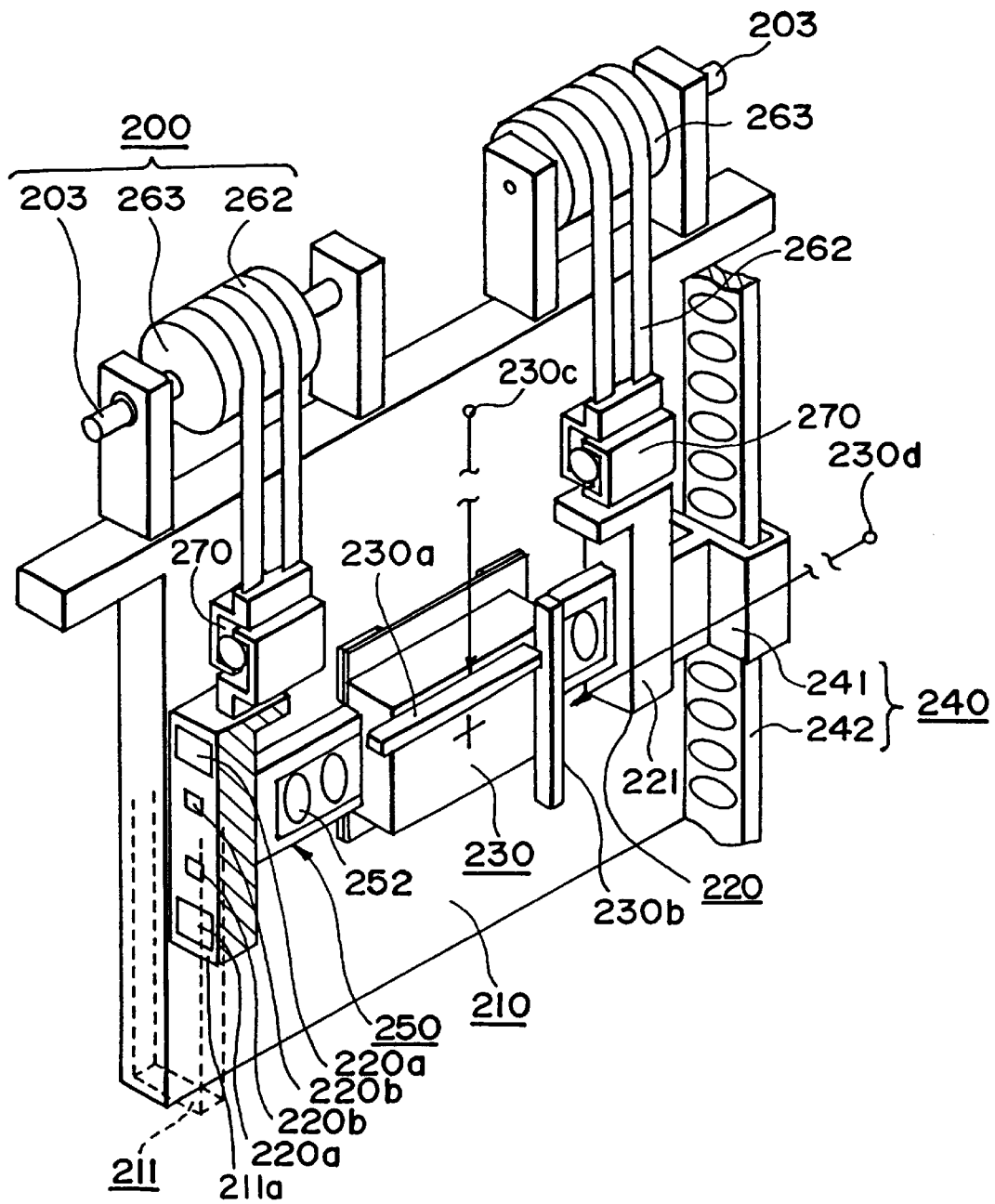
FIG. 23 is a schematic and perspective view of a stage system according to a ninth embodiment of the present invention.

FIG. 23 shows a ninth embodiment of the present invention. In this embodiment, in place of the countermass 161 of the seventh and eighth embodiments, a weight compensation mechanism 200 is used wherein a pulley 263 is rotationally driven by a weight compensation motor 203 which produces a torque that balances with the weight of the stage movable portion, including the Y stage 220 and X stage 230. More specifically, each motor 203 rotates the pulley 263 to wind up the belt 262, to thereby cancel the weight of the stage movable portion.

Each of the belts 262 and the Y stage 202 (Y slider 221) are connected to each other through an actuator 210 (anti-vibration means).

As regards stage base 210, Y guide 211, Y stage 220, X stage 230, Y linear motor 240, X linear motor 250 and so on, they may be similar to those of the first embodiment, and a description therefor will be omitted.

As for actuators 270, a bellowphragm 171, an air cylinder 172 or a linear motor 173 shown in FIGS. 13–15 may be used. In place of the actuator 210, an elastic member such as rubber member 174 of FIG. 16 or a piezoelectric device may be used.

In a weight compensation mechanism without a countermass, if the Y stage is suspended by using a connecting member such as a belt, natural vibration of the belt will become a factor for deteriorating the dynamic characteristic of the stage. Thus, like the seventh or eighth embodiment, an actuator or elastic member having an anti-vibration function may be added. This largely contributes to improvement of speed and precision of the stage system.

The actuators may be controlled on the basis of positional information about the X stage to perform rotational moment correction, similarly to the seventh and eighth embodiments.

The actuator or elastic member (rubber member) may be provided at the connection between the Y stage and the belt, as shown in FIG. 23. Alternatively, it may be provided at the support for the bearing portion of the pulley.

As a further alternative, an elastic member such as a laminated rubber member may be provided on the surface of a pulley for winding the belt, to thereby absorb belt vibration.

[Embodiment 10]

Figure 24:
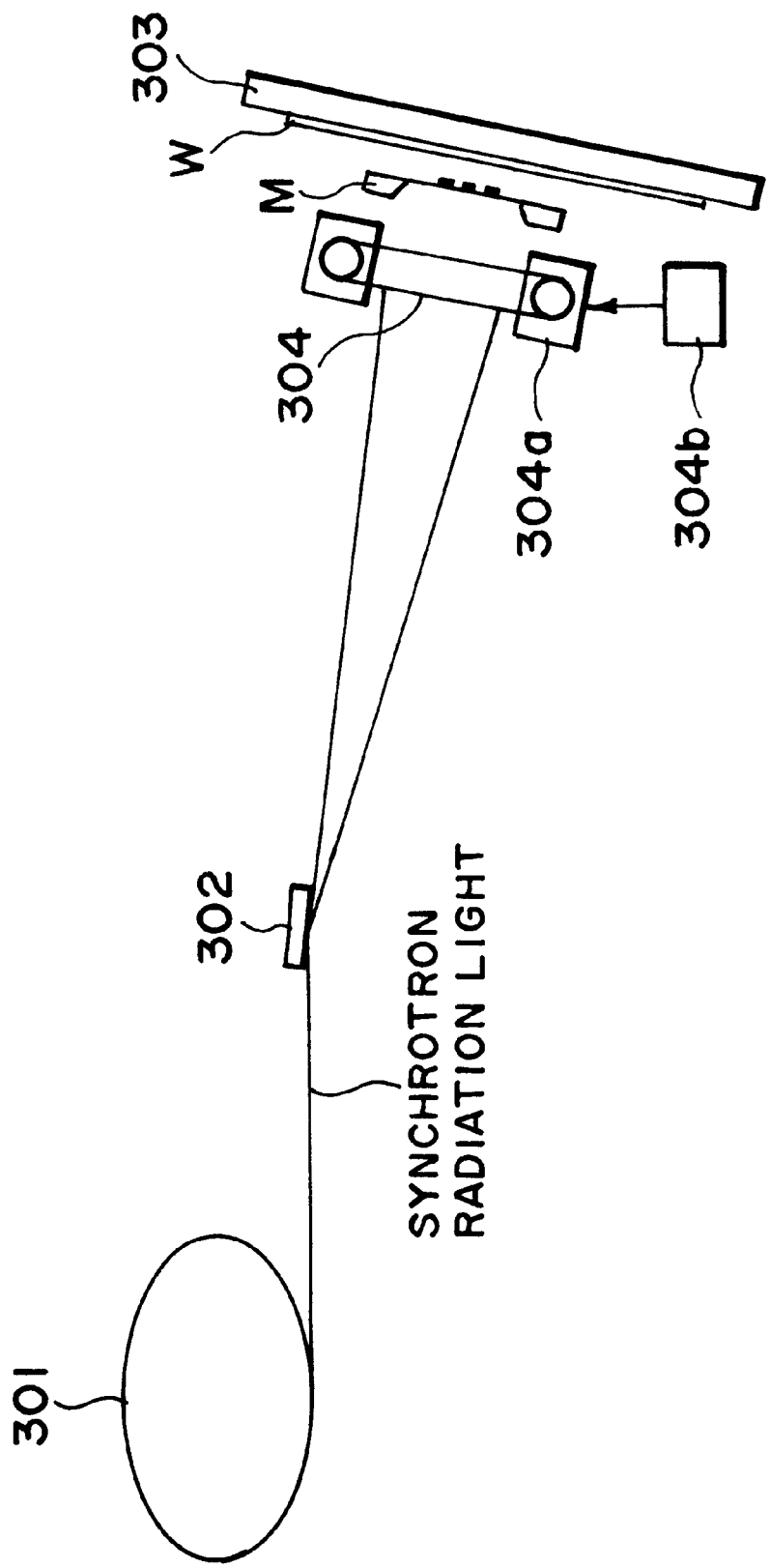
FIG. 24 is a schematic view of a main portion of an X-ray exposure apparatus according to a tenth embodiment of the present invention.

Next, an embodiment of an X-ray exposure apparatus which uses a stage system according to any one of the preceding embodiments, will be explained. FIG. 24 is a schematic view of an X-ray exposure apparatus according to an embodiment of the present invention. Synchrotron radiation light emitted from a synchrotron radiation producing device 301 (X-ray source) impinges on a mirror 302 disposed at a predetermined distance from the light emission point. The mirror 302 has a convex surface shape, and it expands the synchrotron radiation light of a sheet-like beam from the synchrotron radiation source 301. Although only one mirror is illustrated, plural mirrors may be used for expansion of the synchrotron radiation. The synchrotron radiation light reflected by the mirror passes through a transmission type mask M (original) having a pattern of an X-ray absorptive material, formed on an X-ray transmissive film, by which the light is transformed into a desired pattern shape and is projected on a substrate W (wafer). The wafer is coated with a resist material (photosensitive material). The wafer W is held by a wafer chuck 303 of a stage system, according to any one of the preceding embodiments of the present invention described above. The wafer chuck 303 is mounted on a main stage (not shown). Disposed upstream of the mask M is a shutter 304 for controlling exposure time over the whole exposure region. The shutter 304 is actuated by a shutter driving unit 304a which is controlled by a shutter control unit 304b. A beryllium film (not shown) is provided between the mirror 302 and the shutter 304. The mirror side of this beryllium film is maintained at a super vacuum, while the shutter side thereof is maintained at a reduced pressure He.

In accordance with this embodiment of the present invention, an exposure apparatus which meets increases of speed and precision is provided.

[Embodiment 11]

Next, an embodiment of a device manufacturing method which uses an exposure apparatus such as described above, will be explained.

Figure 25:
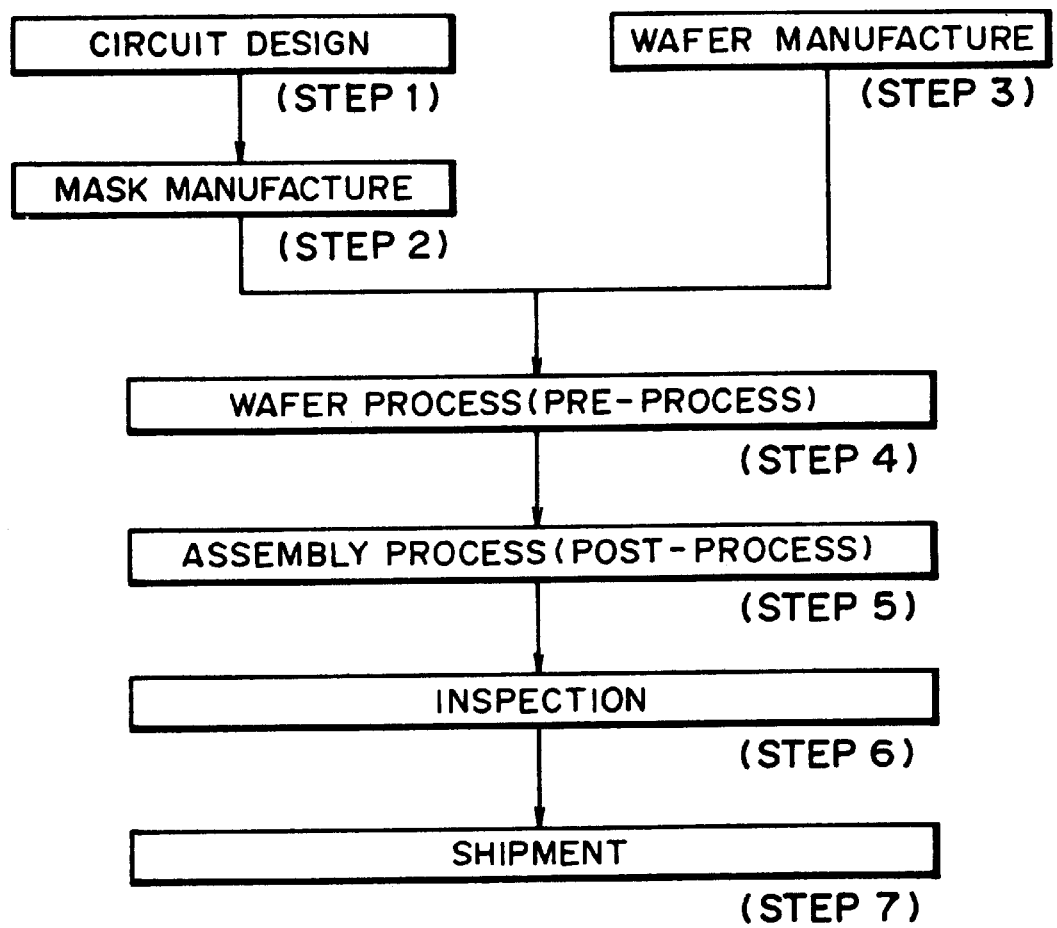
FIG. 25 is a flow chart of semiconductor device manufacturing processes.

FIG. 25 is a flow chart of a procedure for the manufacture of microdevices such as semiconductor chips (e.g., ICs or LSIs), liquid crystal panels, CCDs, thin film magnetic heads or micro-machines, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the so prepared mask and wafer, circuits are practically formed on the wafer through lithography. Step 5 subsequent to this is an assembling step which is called a post-process wherein the wafer having been processed by step 4 is formed into semiconductor chips. This step includes an assembling (dicing and bonding) process and a packaging (chip sealing) process. Step 6 is an inspection step wherein an operation check, a, durability check and so on for the semiconductor devices provided by step 5, are carried out. With these processes, semiconductor devices are completed and they are shipped (step 7).

Figure 26:
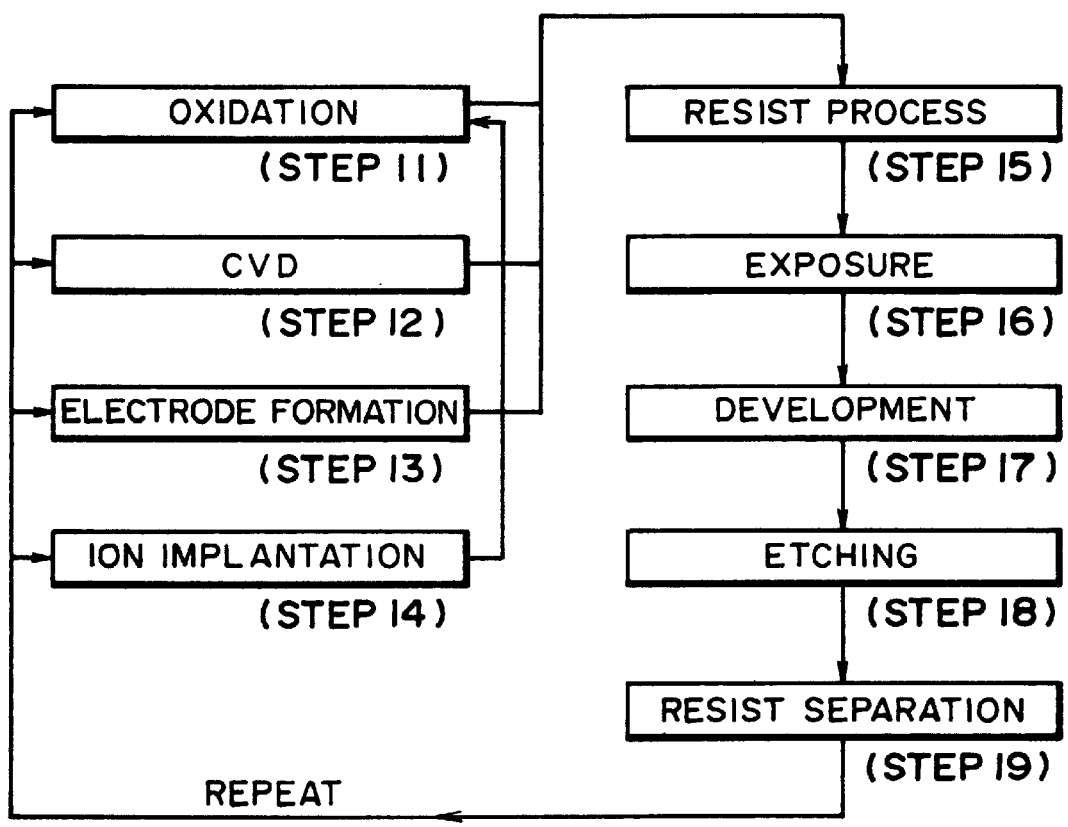
FIG. 26 is a flow chart of a wafer process.
Figure 27:
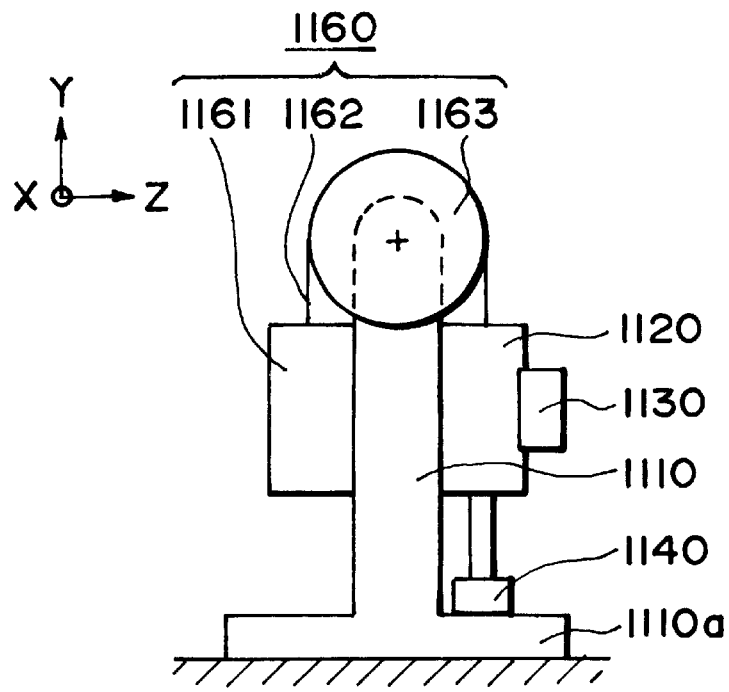
FIGS. 27 and 28 are schematic views, respectively, of a known vertical type stage system.
Figure 28:
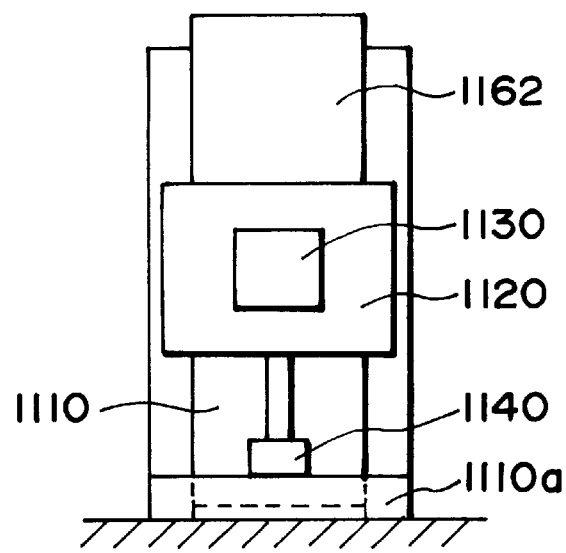

FIG. 26 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

While the invention has been described with reference to the structures disclosed herein, it is not confined to the details set forth and this application is intended to cover such modifications or changes as may come within the purposes of the improvements or the scope of the following claims.

What is claimed is:

1. A stage mechanism, comprising:
 a first stage movable along a reference plane, containing a vertical direction, wherein said first stage is movable in a first direction corresponding to one of the vertical direction and a direction approximating the vertical direction;
 a second stage movable in a second direction intersecting with the first direction and relative to said first stage;
 a first driving mechanism for moving said first stage in the first direction;
 a second driving mechanism for moving said second stage in the second direction;
 a countermass movable in the first direction, said countermass having a mass balancing with a mass of one of said first and second stages, which moves in the first direction; and
 a third driving mechanism for generating a force for moving said countermass in a direction opposite to the first direction.

2. A stage mechanism according to claim 1, further comprising a secondary countermass and a fourth driving mechanism for moving the secondary countermass in a direction opposite to the second direction.

3. A stage mechanism according to claim 1, wherein each of said first and second driving mechanisms comprises a linear motor.

4. A stage mechanism according to claim 2, wherein each of said third and fourth driving mechanisms comprises a linear motor.

5. A stage mechanism according to claim 1, wherein said stage mechanism includes plural countermasses each being said countermass.

6. A stage mechanism according to claim 1, wherein said third driving mechanism is controlled so that a reaction force or a change in gravity center produced due to the motion of the first stage is reduced by movement of the countermass.

7. A stage mechanism according to claim 2, wherein said fourth driving mechanism is controlled so that a reaction force or a change in gravity center produced due to the motion of the second stage is reduced by movement of the countermass.

8. A stage mechanism according to claim 1, further comprising compensating means for compensating for a weight of the first stage and the countermass.

9. A stage mechanism according to claim 8, wherein said compensating means has a connecting mechanism for connecting the stage and the countermass.

10. A stage mechanism according to claim 9, wherein said connecting mechanism includes a pulley and a belt.

11. A stage mechanism according to claim 10, wherein said pulley has a pulley diameter ratio substantially corresponding to an inverse of a mass ratio between the first stage and the countermass.

12. A stage mechanism according to claim 9, wherein said connecting mechanism includes a cylinder mechanism.

13. A stage mechanism according to claim 12, wherein said cylinder mechanism is arranged so that the weight of the first stage and the weight of the countermass are balanced with each other.

14. A stage mechanism according to claim 13, wherein a sectional area of a piston for supporting the first stage and a sectional area of a piston for supporting the weight of the countermass substantially correspond to a mass ratio between the first stage and the countermass.

15. A stage mechanism according to claim 1, further comprising a damper for supporting said stage system.

16. A stage mechanism, comprising:
 a first stage movable along a reference plane, containing a vertical direction, and in the vertical direction or in a first direction close to the vertical direction;
 a second stage movable in a second direction intersecting with the first direction and relative to the first stage;
 a countermass movable in the first direction;
 a first driving mechanism for moving the first stage in the first direction; and
 a second driving mechanism for moving the second stage in the second direction, wherein said first driving mechanism includes a magnet and a coil, one of which is mounted on one of the first stage and the countermass and the other of which is mounted on the other of the first stage and the countermass, such that the countermass moves in a direction opposite to the first stage.

17. A stage mechanism according to claim 16, further comprising a secondary countermass movable in a direction opposite to the second direction.

18. A stage mechanism according to claim 17, wherein said second driving mechanism includes a magnet and a coil, one of which is mounted on one of the second stage and the secondary countermass and the other of which is mounted on the other of the second stage and the secondary countermass, such that the secondary countermass moves in a direction opposite to the second stage.

19. A stage mechanism according to claim 16, further comprising compensating means for compensating for a weight of the first stage and the countermass.

20. A stage mechanism according to claim 19, wherein said compensating means has a connecting mechanism for connecting the stage and the countermass.

21. A stage mechanism according to claim 20, wherein said connecting mechanism includes a pulley and a belt.

22. A stage mechanism according to claim 21, wherein said pulley has a pulley diameter ratio substantially corresponding to an inverse of a mass ratio between the first stage and the countermass.

23. A stage mechanism according to claim 20, wherein said connecting mechanism includes a cylinder mechanism.

24. A stage mechanism according to claim 23, wherein said cylinder mechanism is arranged so that the weight of the first stage and the weight of the countermass are balanced with each other.

25. A stage mechanism according to claim 24, wherein a sectional area of a piston for supporting the first stage and a sectional area of a piston for supporting the weight of the countermass substantially correspond to a mass ratio between the first stage and the countermass.

26. A stage system, comprising:
  a stage movable along a reference plane, containing a vertical direction, and in the vertical direction or a direction close to the vertical direction;
  a countermass, balancing with a weight of the stage;
  connecting members for connecting the countermass to the stage;
  a pulley for supporting said connecting members; and
  an anti-vibration mechanism for reducing vibration to be propagated from said connecting members to the stage.

27. A stage mechanism according to claim 26, wherein said anti-vibration mechanism is provided at one of a connection between the connecting members and the countermass, and a connection between the stage and the connecting members.

28. A stage system according to claim 27, wherein said anti-vibration mechanism includes an elastic member.

29. A stage system according to claim 28, wherein said elastic member comprises laminated rubber.

30. A stage system according to claim 26, wherein said anti-vibration mechanism includes an elastic member provided at one of a supporting portion for supporting a bearing of the pulley and the surface of the pulley.

31. A stage system according to claim 26, wherein said anti-vibration mechanism comprises a rotary type static bearing for rotatably supporting a bearing of the pulley.

32. A stage system according to claim 26, wherein said anti-vibration mechanism includes an actuator for producing a force.

33. A stage system according to claim 26, further comprising a static bearing device for maintaining the stage out of contact with the reference plane.

34. A stage system according to claim 26, wherein the stage comprises a two-dimensional stage movable two-dimensionally along the reference plane.

35. A stage system according to claim 34, further comprising a yaw guide for guiding the stage in the vertical direction, and a yaw guide static bearing for maintaining the stage out of contact with the yaw stage.

36. A stage system according to claim 26, wherein each of the connecting members comprises one of a steel belt and a steel wire.

37. A stage system, comprising:
  a stage movable along a reference plane, containing a vertical direction, and in the vertical direction or a first direction close to the vertical direction;
  connecting members connected to the stage;
  a pulley for supporting said connecting members;
  a motor for rotationally driving the pulley and for compensating for a weight of the stage; and
  an anti-vibration mechanism for reducing vibration to be propagated from said connecting members to the stage.

38. A stage system according to claim 37, wherein said anti-vibration mechanism is provided at a connection between the stage and the connecting members.

39. A stage system according to claim 38, wherein said anti-vibration mechanism includes an elastic member.

40. A stage system according to claim 39, wherein said elastic member comprises laminated rubber.

41. A stage system according to claim 37, wherein said anti-vibration mechanism includes an elastic member provided at one of a supporting portion for supporting a bearing of the pulley and the surface of the pulley.

42. A stage system according to claim 37, wherein said anti-vibration mechanism comprises a rotary type static bearing for rotatably supporting a bearing of the pulley.

43. A stage system according to claim 37, wherein said anti-vibration mechanism includes an actuator for producing a force.

44. A stage system according to claim 37, further comprising a static bearing device for maintaining the stage out of contact with the reference plane.

45. A stage system according to claim 37, wherein the stage comprises a two-dimensional stage movable two-dimensionally along the reference plane.

46. A stage system according to claim 45, further comprising a yaw guide for guiding the stage in the vertical direction, and a yaw guide static bearing for maintaining the stage out of contact with the yaw guide.

47. A stage system according to claim 37, wherein each of the connecting members comprises one of a steel belt and a steel wire.

48. A stage system, comprising:
  a stage movable along a reference plane, containing a vertical direction, and in the vertical direction or a direction close to the vertical direction;
  a countermass, balancing with a weight of the stage;
  connecting members for connecting the countermass to the stage;
  a pulley for supporting said connecting members; and
  an actuator for adjusting one of a tension force of and an effective length of the connecting members.

49. A stage system according to claim 48, further comprising control means for controlling said actuator on the basis of positional information about the stage.

50. A stage system according to claim 48, wherein said actuator is provided at one of a connection between the connecting members and the countermass, and a connection between the stage and the connecting members.

51. A stage system according to claim 48, wherein said actuator is provided at a supporting portion for supporting the pulley.

52. A stage system according to claim 48, wherein said actuator includes at least one of an air spring, an air cylinder, a linear motor and a piezoelectric device.

53. A stage system according to claim 48, further comprising a static bearing device for maintaining the stage out of contact with the reference plane.

54. A stage system according to claim 48, wherein the stage comprises a two-dimensional stage movable two-dimensionally along the reference plane.

55. A stage system according to claim 54, further comprising a yaw guide for guiding the stage in the vertical direction, and a yaw guide static bearing for maintaining the stage out of contact with the yaw guide.

56. A stage system according to claim 48, wherein each of the connecting members comprises one of a steel belt and a steel wire.

57. An exposure apparatus, comprising:
a first stage movable along a reference plane, containing a vertical direction, wherein the first stage is movable in a first direction corresponding to one of the vertical direction and a direction approximating the vertical direction;
a second stage movable in a second direction intersecting with the first direction and relative to the first stage;
a first driving mechanism for moving the first stage in the first direction;
a second driving mechanism for moving the second stage in the second direction;
a countermass movable in the first direction, said countermass having a mass balancing with a mass of one of said first and second stages, which moves in the first direction; and
a third driving mechanism for generating a force for moving the countermass in a direction opposite to the first direction.

58. An apparatus according to claim 57, wherein said exposure apparatus comprises an X-ray exposure apparatus.

59. An exposure apparatus, comprising:
a first stage movable along a reference plane, containing a vertical direction, and in the vertical direction or in a first direction close to the vertical direction;
a second stage movable in a second direction intersecting with the first direction and relative to the first stage;
a countermass movable in the first direction;
a first driving mechanism for moving the first stage in the first direction; and
a second driving mechanism for moving the second stage in the second direction,
wherein said first driving mechanism includes a magnet and a coil, one of which is mounted on one of the first stage and the countermass and the other of which is mounted on the other of the first stage and the countermass, such that the countermass moves in a direction opposite to the first stage.

60. An apparatus according to claim 59, wherein said exposure apparatus comprises an X-ray exposure apparatus.

61. An exposure apparatus, comprising:
a stage movable along a reference plane, containing a vertical direction, and in the vertical direction or a direction close to the vertical direction;
a countermass, balancing with a weight of the stage;
connecting members for connecting the countermass to the stage;
a pulley for supporting said connecting members; and
an anti-vibration mechanism for reducing vibration to be propagated from said connecting members to the stage.

62. An apparatus according to claim 61, wherein said exposure apparatus comprises an X-ray exposure apparatus.

63. An exposure apparatus, comprising:
a stage movable along a reference plane, containing a vertical direction, and in the vertical direction or a first direction close to the vertical direction;
connecting members connected to the stage;
a pulley for supporting said connecting members;
a motor for rotationally driving the pulley and for compensating for a weight of the stage; and
an anti-vibration mechanism for reducing vibration to be propagated from said connecting members to the stage.

64. An apparatus according to claim 63, wherein said exposure apparatus comprises an X-ray exposure apparatus.

65. An exposure apparatus, comprising:
a stage movable along a reference plane, containing a vertical direction, and in the vertical direction or a direction close to the vertical direction;
a countermass, balancing with a weight of the stage;
connecting members for connecting the countermass to the stage;
a pulley for supporting said connecting members; and
an actuator for adjusting one of a tension force of and an effective length of the connecting members.

66. An apparatus according to claim 65, wherein said exposure apparatus comprises an X-ray exposure apparatus.

67. A device manufacturing method, comprising the steps of:
applying a photosensitive material to a wafer;
exposing the wafer by use of an exposure apparatus; and
developing the exposed wafer,
wherein the exposure apparatus comprises (i) a first stage movable along a reference plane, containing a vertical direction, wherein the first stage is movable in a first direction corresponding to one of the vertical direction and a direction approximating the vertical direction, (ii) a second stage movable in a second direction intersecting with the first direction and relative to the first stage, (iii) a first driving mechanism for moving the first stage in the first direction, (iv) a second driving mechanism for moving the second stage in the second direction, (v) a countermass movable in the first direction, the countermass having a mass balancing with a mass of one of the first and second stages, which moves in the first direction, and (vi) a third driving mechanism for generating a force for moving the countermass in a direction opposite to the first direction.

68. A device manufacturing method, comprising the steps of:
applying a photosensitive material to a wafer;
exposing the wafer by use of an exposure apparatus; and
developing the exposed wafer,
wherein the exposure apparatus comprises (i) a stage movable along a reference plane, containing a vertical direction, and in the vertical direction or a direction close to the vertical direction, (ii) a countermass, balancing with a weight of the stage, (iii) connecting members for connecting the countermass to the stage, (iv) a pulley for supporting the connecting members, and (v) an anti-vibration mechanism for reducing vibration to be propagated from the connecting members to the stage.

69. A device manufacturing method, comprising the steps of:

applying a photosensitive material to a wafer;

exposing the wafer by use of an exposure apparatus; and developing the exposed wafer, wherein the exposure apparatus comprises (i) a stage movable along a reference plane, containing a vertical direction, and in the vertical direction or a first direction close to the vertical direction, (ii) connecting members connected to the stage, (iii) a pulley for supporting the connecting members, (iv) a motor for rotationally driving the pulley and for compensating for a weight of the stage, and (v) an anti-vibration mechanism for reducing vibration to be propagated from the connecting members to the stage.

70. A device manufacturing method, comprising the steps of:

applying a photosensitive material to a wafer;

exposing the wafer by use of an exposure apparatus; and developing the exposed wafer, wherein the exposure apparatus comprises (i) a stage movable along a reference plane, containing a vertical direction, and in the vertical direction or a direction close to the vertical direction, (ii) a countermass, balancing with a weight of the stage, (iii) connecting members for connecting the countermass to the stage, (iv) a pulley for supporting the connecting members, and (v) an actuator for adjusting one of a tension force of and an effective length of the connection members.

71. A stage mechanism, comprising:

a first stage movable along a reference plane, containing a vertical direction, and in the vertical direction or in a first direction close to the vertical direction;

a second stage movable in a second direction intersecting with the first direction and relative to said first stage;

a first driving mechanism for moving said first stage in the first direction;

a second driving mechanism for moving said second stage in the second direction;

a countermass movable in the first direction;

a third driving mechanism for moving said countermass in a direction opposite to the first direction; and compensating means for compensating for a weight of said first stage and said countermass, wherein said compensating means comprises a connecting mechanism for connecting said stage and said countermass, said connecting mechanism includes a pulley and a belt, and said pulley has a pulley diameter ratio substantially corresponding to an inverse of a mass ratio between said first stage and said countermass.

* * * * *

UNITED STATES PATENT AND TRADEMARK OFFICE
CERTIFICATE OF CORRECTION

PATENT NO.    : 6,408,045 B1
DATED         : June 18, 2002
INVENTOR(S)   : Matsui et al.

It is certified that error appears in the above-identified patent and that said Letters Patent is hereby corrected as shown below:

Drawings,
FIGURE 17:
In the third box in the top row, "AMPLIFYER" should read -- AMPLIFIER --.
In the third box in the bottom row, "AMPLIFYER" should read -- AMPLIFIER --.
FIGURE 18:
In the third box in the top row, "AMPLIFYER" should read -- AMPLIFIER --.
In the third box in the bottom row, "AMPLIFYER" should read -- AMPLIFIER --.

Column 1,
Line 66, "140" should read -- 1140 --.

Column 2,
Line 25, "can not" should read -- cannot --.

Column 6,
Line 28, "descried" should read -- described --.

Column 10,
Line 7, "gravity" should be deleted.

Column 17,
Line 37, "t he" should read -- the --.

Column 23,
Line 27, "a," should read -- a --.

UNITED STATES PATENT AND TRADEMARK OFFICE
CERTIFICATE OF CORRECTION

PATENT NO.    : 6,408,045 B1
DATED         : June 18, 2002
INVENTOR(S)   : Matsui et al.

It is certified that error appears in the above-identified patent and that said Letters Patent is hereby corrected as shown below:

<u>Column 30,</u>
Following the last line, insert:

-- 72.  A stage mechanism comprising:
   a first stage movable along a reference plane, containing a vertical direction, wherein said first stage is movable in a first direction corresponding to one of the vertical direction and a direction approximating the vertical direction;
   a second stage movable in a second direction intersecting with the first direction and relative to said first stage;
   a first driving mechanism for moving said first stage in the first direction;
   a second driving mechanism for moving said second stage in the second direction;
   a countermass movable in the first direction, said countermass having a mass balancing with a mass of one of said first and second stages, which moves in the first direction;
   a third driving mechanism for moving said countermass in a direction opposite to the first direction; and
   a secondary countermass and a fourth driving mechanism for moving the secondary countermass in a direction opposite to the second direction.

73.  A stage mechanism comprising:
   a first stage movable along a reference plane, containing a vertical direction, wherein said first stage is movable in a first direction corresponding to one of the vertical direction and a direction approximating the vertical direction;
   a second stage movable in a second direction intersecting with the first direction and relative to said first stage;
   a first driving mechanism for moving said first stage in the first direction;
   a second driving mechanism for moving said second stage in the second direction;
   a countermass movable in the first direction, said countermass having a mass balancing with a mass of one of said first and second stages, which moves in the first direction; and
   a third driving mechanism for moving said countermass in a direction opposite to the first direction,
   wherein said stage mechanism includes plural countermasses each being said countermass.

74.  A stage mechanism comprising:
   a first stage movable along a reference plane, containing a vertical direction, wherein said first stage is movable in a first direction corresponding to one of the vertical direction and a direction approximating the vertical direction;
   a second stage movable in a second direction intersecting with the first direction and relative to said first stage;
   a first driving mechanism for moving said first stage in the first direction;
   a second driving mechanism for moving said second stage in the second direction;

UNITED STATES PATENT AND TRADEMARK OFFICE
CERTIFICATE OF CORRECTION

PATENT NO.     : 6,408,045 B1
DATED          : June 18, 2002
INVENTOR(S)    : Matsui et al.

It is certified that error appears in the above-identified patent and that said Letters Patent is hereby corrected as shown below:

a countermass movable in the first direction, said countermass having a mass balancing with a mass of one of said first and second stages, which moves in the first direction; and
      a third driving mechanism for moving said countermass in a direction opposite to the first direction,
      wherein said third driving mechanism is controlled so that a reaction force or a change in gravity center produced due to the motion of the first stage is reduced by movement of the countermass.

75.  A stage mechanism comprising:
      a first stage movable along a reference plane, containing a vertical direction, wherein said first stage is movable in a first direction corresponding to one of the vertical direction and a direction approximating the vertical direction;
      a second stage movable in a second direction intersecting with the first direction and relative to said first stage;
      a first driving mechanism for moving said first stage in the first direction;
      a second driving mechanism for moving said second stage in the second direction;
      a countermass movable in the first direction, said countermass having a mass balancing with a mass of one of said first and second stages, which moves in the first direction;
      a third driving mechanism for moving said countermass in a direction opposite to the first direction; and
      compensating means for compensating for a weight of the first stage and the countermass.

UNITED STATES PATENT AND TRADEMARK OFFICE
CERTIFICATE OF CORRECTION

PATENT NO.     : 6,408,045 B1
DATED          : June 18, 2002
INVENTOR(S)    : Matsui et al.

It is certified that error appears in the above-identified patent and that said Letters Patent is hereby corrected as shown below:

76.  An exposure apparatus, comprising:
          a stage system as recited in any one of Claims 72-75 for holding a substrate; and
          an exposure system for exposing the substrate.

77.  A device manufacturing method, comprising the steps of:
          exposing a wafer with a device pattern, by use of an exposure apparatus as recited in Claim 76; and
          developing the exposed wafer. --

Signed and Sealed this

Twenty-seventh Day of May, 2003

JAMES E. ROGAN
*Director of the United States Patent and Trademark Office*